US009815087B2

(12) United States Patent
Ganti et al.

(10) Patent No.: US 9,815,087 B2
(45) Date of Patent: Nov. 14, 2017

(54) MICROMECHANICAL ULTRASONIC TRANSDUCERS AND DISPLAY

(71) Applicant: QUALCOMM Incorporated, San Diego, CA (US)

(72) Inventors: Suryaprakash Ganti, Los Altos, CA (US); David William Burns, San Jose, CA (US); Jonathan Charles Griffiths, Fremont, CA (US)

(73) Assignee: QUALCOMM Incorporated, San Diego, CA (US)

( * ) Notice: Subject to any disclaimer, the term of this patent is extended or adjusted under 35 U.S.C. 154(b) by 39 days.

(21) Appl. No.: 14/569,280

(22) Filed: Dec. 12, 2014

(65) Prior Publication Data
US 2015/0169136 A1 Jun. 18, 2015

Related U.S. Application Data

(60) Provisional application No. 61/915,361, filed on Dec. 12, 2013, provisional application No. 62/022,140, filed on Jul. 8, 2014.

(51) Int. Cl.
*G06F 3/041* (2006.01)
*B06B 1/06* (2006.01)
(Continued)

(52) U.S. Cl.
CPC ............ *B06B 1/0666* (2013.01); *G06F 3/043* (2013.01); *G06F 3/0412* (2013.01);
(Continued)

(58) Field of Classification Search
CPC ..... B06B 1/0666; G06F 3/0412; G06F 3/043; G06F 3/0436; G10K 9/125; H01L 41/31;
(Continued)

(56) References Cited

U.S. PATENT DOCUMENTS 6,381,197 B1 * 4/2002 Savord ................ B06B 1/0292
367/178
8,539,837 B2 9/2013 Wong et al.
(Continued)

FOREIGN PATENT DOCUMENTS

CN 101712028 A 5/2010
CN WO 2015009635 A1 * 1/2015 .......... G06K 9/0002
(Continued)

OTHER PUBLICATIONS

Siu, T and Chiao, M, "MEMS-Based Ultrasonic Devices," 2008, Taylor and Francis Group, LLC.*
(Continued)

*Primary Examiner* — Nicholas Lee
*Assistant Examiner* — Gerald Oliver
(74) *Attorney, Agent, or Firm* — Weaver Austin Villeneuve & Sampson LLP

(57) ABSTRACT

An apparatus may include a one- or two-dimensional array of micromechanical ultrasonic transducer (PMUT) elements positioned below, beside, with, on, or above a backplane of a visual display. The backplane may be a thin-film transistor (TFT) backplane. The array of PMUT elements may be a piezoelectric micromechanical ultrasonic transducer (PMUT) array or a capacitive micromechanical ultrasonic transducer (CMUT) array. The PMUT array may be configurable to operate in modes corresponding to multiple frequency ranges. When operating in the low-frequency mode, the apparatus may be capable of gesture detection. A high-frequency mode may include a fingerprint sensor mode or a stylus detection mode.

32 Claims, 19 Drawing Sheets

(51) Int. Cl.
  *G10K 9/125* (2006.01)
  *H01L 41/31* (2013.01)
  *G06F 3/043* (2006.01)
  *G06K 9/00* (2006.01)

(52) U.S. Cl.
  CPC ........... *G06F 3/0436* (2013.01); *G10K 9/125* (2013.01); *H01L 41/31* (2013.01); *G06K 9/0002* (2013.01); *G06K 9/00335* (2013.01); *Y10T 29/42* (2015.01)

(58) Field of Classification Search
  CPC ... G06K 9/00335; G06K 9/0002; Y10T 29/42
  See application file for complete search history.

(56) References Cited

U.S. PATENT DOCUMENTS

| | | | |
|---|---|---|---|
| 8,581,865 B2 | 11/2013 | Choo et al. | |
| 8,890,853 B2 | 11/2014 | Schuele et al. | |
| 2003/0067249 A1 | 4/2003 | Lockwood et al. | |
| 2003/0119220 A1 | 6/2003 | Mlcak et al. | |
| 2005/0081040 A1* | 4/2005 | Johnson | G06F 21/32 713/176 |
| 2006/0181521 A1 | 8/2006 | Perrault et al. | |
| 2007/0040477 A1 | 2/2007 | Sugiura et al. | |
| 2008/0179080 A1* | 7/2008 | Tanaka | H05K 3/361 174/254 |
| 2009/0021475 A1 | 1/2009 | Steinle et al. | |
| 2009/0235750 A1 | 9/2009 | Chang et al. | |
| 2010/0013574 A1* | 1/2010 | Huang | H03H 3/0072 333/186 |
| 2010/0045141 A1 | 2/2010 | Pulskamp et al. | |
| 2010/0045142 A1 | 2/2010 | Pulskamp et al. | |
| 2010/0052478 A1 | 3/2010 | Schneider et al. | |
| 2010/0237992 A1 | 9/2010 | Liautaud | |
| 2010/0251824 A1* | 10/2010 | Schneider | A61B 5/1172 73/620 |
| 2011/0120843 A1 | 5/2011 | Wunnicke et al. | |
| 2011/0210554 A1 | 9/2011 | Boysel | |
| 2011/0285244 A1* | 11/2011 | Lewis | B06B 1/023 310/317 |
| 2012/0062433 A1* | 3/2012 | Balanis | H01Q 1/38 343/720 |
| 2012/0069715 A1* | 3/2012 | Okuno | A61B 8/4444 367/180 |
| 2012/0206014 A1 | 8/2012 | Bibl et al. | |
| 2013/0133428 A1 | 5/2013 | Lee et al. | |
| 2013/0201134 A1* | 8/2013 | Schneider | G06F 3/041 345/173 |
| 2013/0294201 A1 | 11/2013 | Hajati | |
| 2013/0294202 A1* | 11/2013 | Hajati | H01L 41/0825 367/138 |
| 2014/0253435 A1* | 9/2014 | Boser | G06F 3/043 345/156 |
| 2015/0165479 A1 | 6/2015 | Lasiter et al. | |

FOREIGN PATENT DOCUMENTS

| | | |
|---|---|---|
| WO | WO2006093913 A2 | 9/2006 |
| WO | WO2015089453 A1 | 6/2015 |
| WO | WO2016007250 A1 | 1/2016 |

OTHER PUBLICATIONS

International Search Report and Written Opinion—PCT/US2014/070114—ISA/EPO—dated Mar. 19, 2015.
International Preliminary Report on Patentability and Written Opinion—PCT/US2014/070114—ISA/EPO—dated Jun. 23, 2016.
International Search Report and Written Opinion—PCT/US2015/034729—ISA/EPO—dated Nov. 13, 2015.
Second Written Opinion of the International Preliminary Examining Authority—PCT/US2015/034729—ISA/EPO—dated Jul. 1, 2016.
International Preliminary Report on Patentability and Written Opinion—PCT/US2015/034729—ISA/EPO—dated Sep. 26, 2016.
U.S. Restriction Requirement dated May 12, 2017in U.S. Appl. No. 14/569,256.

\* cited by examiner

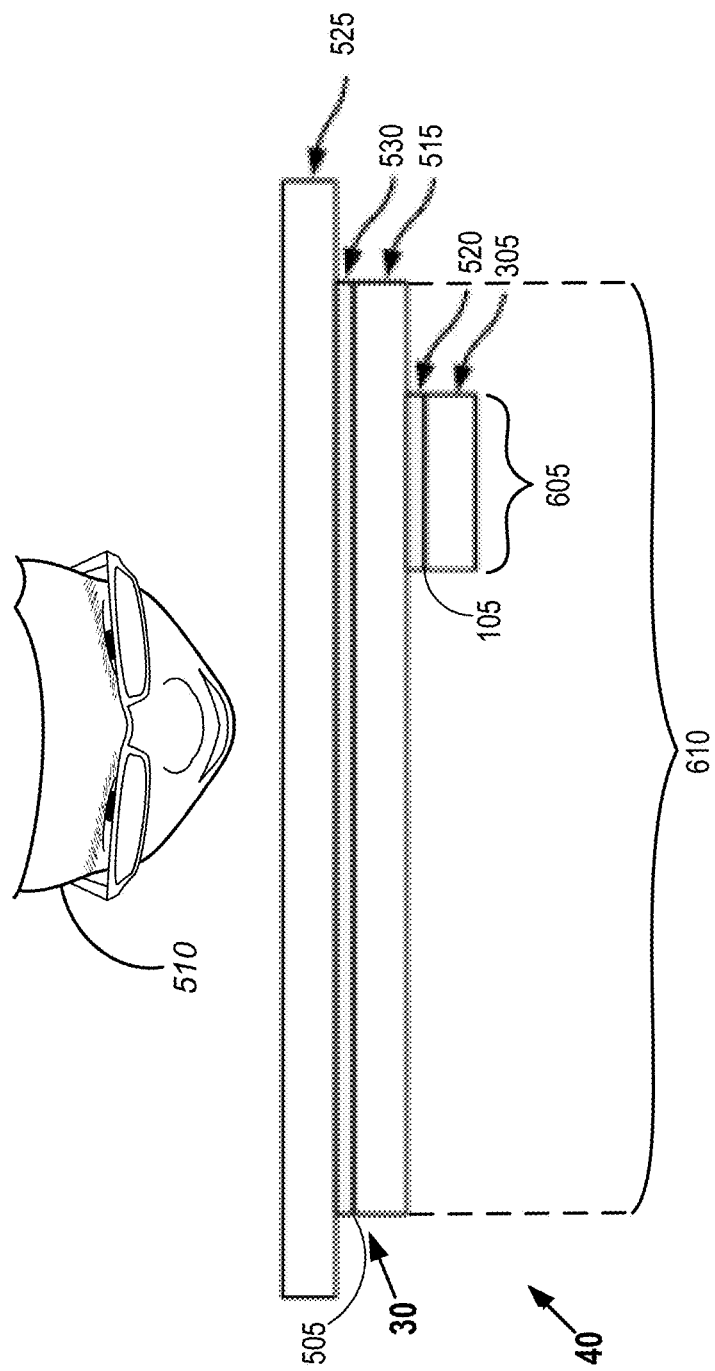

MICROMECHANICAL ULTRASONIC TRANSDUCERS AND DISPLAY

PRIORITY CLAIM

This application claims priority to U.S. Provisional Patent Application No. 61/915,361, filed on Dec. 12, 2013 and entitled "MICROMECHANICAL ULTRASONIC TRANSDUCERS AND DISPLAY," and to U.S. Provisional Patent Application No. 62/022,140, filed on Jul. 8, 2014 and entitled "PIEZOELECTRIC ULTRASONIC TRANSDUCER AND PROCESS," which are hereby incorporated by reference.

TECHNICAL FIELD

This disclosure relates to displays that include sensor elements, and more particularly to a piezoelectric ultrasonic transducer suitable for use in an electronic sensor array or interactive display for biometric sensing, imaging, and touch or gesture recognition.

DESCRIPTION OF THE RELATED TECHNOLOGY

Current display touchscreens, such as liquid crystal display (LCD) and organic light-emitting diode (OLED) touchscreens, generally include pixels with at least three (e.g., RGB) sub-pixel elements and rely on overlying capacitive touch screens for detecting the touch of a finger. The resolution of the capacitive touch screens is generally insufficient for fingerprint imaging or stylus detection, and the range of detection is generally insufficient for gesture detection because capacitive touch detection is typically limited to a few millimeters from the touchscreen surface.

SUMMARY

The systems, methods and devices of the disclosure each have several innovative aspects, no single one of which is solely responsible for the desirable attributes disclosed herein. One innovative aspect of the subject matter described in this disclosure can be implemented in an apparatus which includes an array of piezoelectric micromechanical ultrasonic transducer (PMUT) elements positioned proximate (e.g., below, beside, on, or above) a display. The apparatus may include a control system.

In some implementations, the control system may be capable of making a determination whether to operate at least a portion of the PMUT array in a low-frequency mode and/or a high-frequency mode. The control system may be capable of controlling at least a portion of the PMUT array to operate in the low-frequency mode and/or the high-frequency mode, according to the determination. The display device may include an interface system. In some examples, the determination may be made, at least in part, according to input received from the interface system.

According to some implementations, the low-frequency mode may correspond to a frequency range of approximately 50 kHz to 200 kHz. In some examples, the low-frequency mode may correspond to a gesture detection mode, wherein free-space gestures near the display may be detected. According to some implementations, the high-frequency mode may correspond to a frequency range of approximately 1 MHz to 25 MHz. In some examples, the high-frequency mode may correspond to a fingerprint sensor mode or a stylus detection mode.

In some implementations, the control system may be capable of performing an authentication process based, at least in part, on fingerprint data acquired while the PMUT array operates in the fingerprint sensor mode. In some examples, the apparatus may include a memory system. In some such examples, the authentication process may involve the following: providing a prompt, via the display, to place at least one finger on a surface of the display device; receiving, via at least a portion of the PMUT array, at least one fingerprint image; determining received fingerprint data corresponding to the at least one fingerprint image; and comparing the received fingerprint data with stored fingerprint data in the memory system.

According to some implementations, the control system may be capable of making a determination whether to operate at least a portion of the PMUT array in the high-frequency mode, the low-frequency mode and/or a medium-frequency mode. The control system may be capable of controlling at least a portion of the PMUT array to operate in the high-frequency mode, the low-frequency mode and/or the medium-frequency mode, according to the determination. In some examples, the medium-frequency mode may correspond to a frequency range of approximately 200 kHz to 1 MHz. According to some implementations, the display device may be capable of providing touch sensor functionality when the control system is controlling at least a portion of the PMUT array to operate in the medium-frequency mode.

In some implementations, the control system may be capable of controlling some PMUT elements of the PMUT array to operate in the low-frequency mode and other PMUT elements of the PMUT array to operate in the high-frequency mode. Alternatively, or additionally, the control system may be capable of controlling the same PMUT element of the PMUT array to operate in the low-frequency mode and to operate in the high-frequency mode. In some examples, the PMUT array may be a piezoelectric micromechanical ultrasonic transducer (pMUT) array or a capacitive micromechanical ultrasonic transducer (cMUT) array.

According to some implementations, the control system may be capable of addressing at least a portion of the PMUT array for at least one of wavefront beam forming, beam steering, receive-side beam forming, or selective readout of returned signals. For example, in some implementations the control system may be capable of addressing at least a portion of the PMUT array to produce wavefronts of a substantially planar, spherical or cylindrical shape. In some implementations, the control system may be capable of addressing at least a portion of the PMUT array to produce constructive or destructive interference in at least one location.

In some examples, the control system may be capable of exciting PMUT elements of the PMUT array and detecting responses via the same PMUT elements. Alternatively, or additionally, the control system may be capable of controlling a first PMUT element of the PMUT array as an acoustic transmitter and a second PMUT element of the PMUT array as an acoustic receiver.

According to some implementations, at least a portion of the PMUT array may be an active matrix PMUT array. In some examples, the active matrix PMUT array may include drive circuitry and sense circuitry. In some implementations, the active matrix PMUT array may include row and column addressing circuitry, multiplexer circuitry, demultiplexer circuitry, local amplification circuitry and/or analog-to-digital conversion circuitry.

In some implementations, at least a portion of the PMUT array may be disposed behind substantially all of the display. In some such implementations, a single PMUT element of the PMUT array may correspond with a single pixel of the display. However, in some examples, at least a portion of the PMUT array may be disposed behind only a part of the display.

Alternatively, or additionally, at least a portion of the PMUT array may be disposed in a peripheral area of the display. According to some implementations, the control system may be capable of controlling a portion of the PMUT array that is disposed in the peripheral area of the display for fingerprint sensor functionality, signature pad functionality, stylus detection functionality, gesture detection functionality and/or button functionality.

In some examples, at least a portion of the PMUT array may be disposed on a substrate. According to some implementations, the substrate may be a glass substrate. However, in alternative implementations the substrate may be formed of another suitable material, which may or may not be transparent according to the particular implementation.

According to some implementations, at least one array of thin-film transistors (TFTs) also may be disposed on the substrate. In some such implementations, at least one array of TFTs may include circuitry for controlling the display. In some examples, at least one array of TFTs may include circuitry for controlling at least a portion of the PMUT array. In some such implementations, the circuitry for controlling at least a portion of the PMUT array and the circuitry for controlling the display may be capable of sharing a flex cable. According to some implementations, at least one array of TFTs that includes circuitry for controlling the display may be disposed on a second substrate.

In some implementations, the apparatus may include a cover glass and electrodes disposed on the cover glass. The electrodes may be configured for topside electrical connections to circuitry for controlling at least a portion of the PMUT array. In some such implementations, the electrodes may be configured for connections with circuitry for at least one PMUT element that may be disposed on a periphery of the display.

Other features, aspects, and advantages will become apparent from a review of the disclosure. Note that the relative dimensions of the drawings and other diagrams of this disclosure may not be drawn to scale. The sizes, thicknesses, arrangements, materials, etc., shown and described in this disclosure are made only by way of example and should not be construed as limiting.

BRIEF DESCRIPTION OF THE DRAWINGS

FIG. 6A shows an example of a display device that includes a PMUT array behind only a portion of a display.

Like reference numbers and designations in the various drawings indicate like elements.

DETAILED DESCRIPTION

Figure 1A:
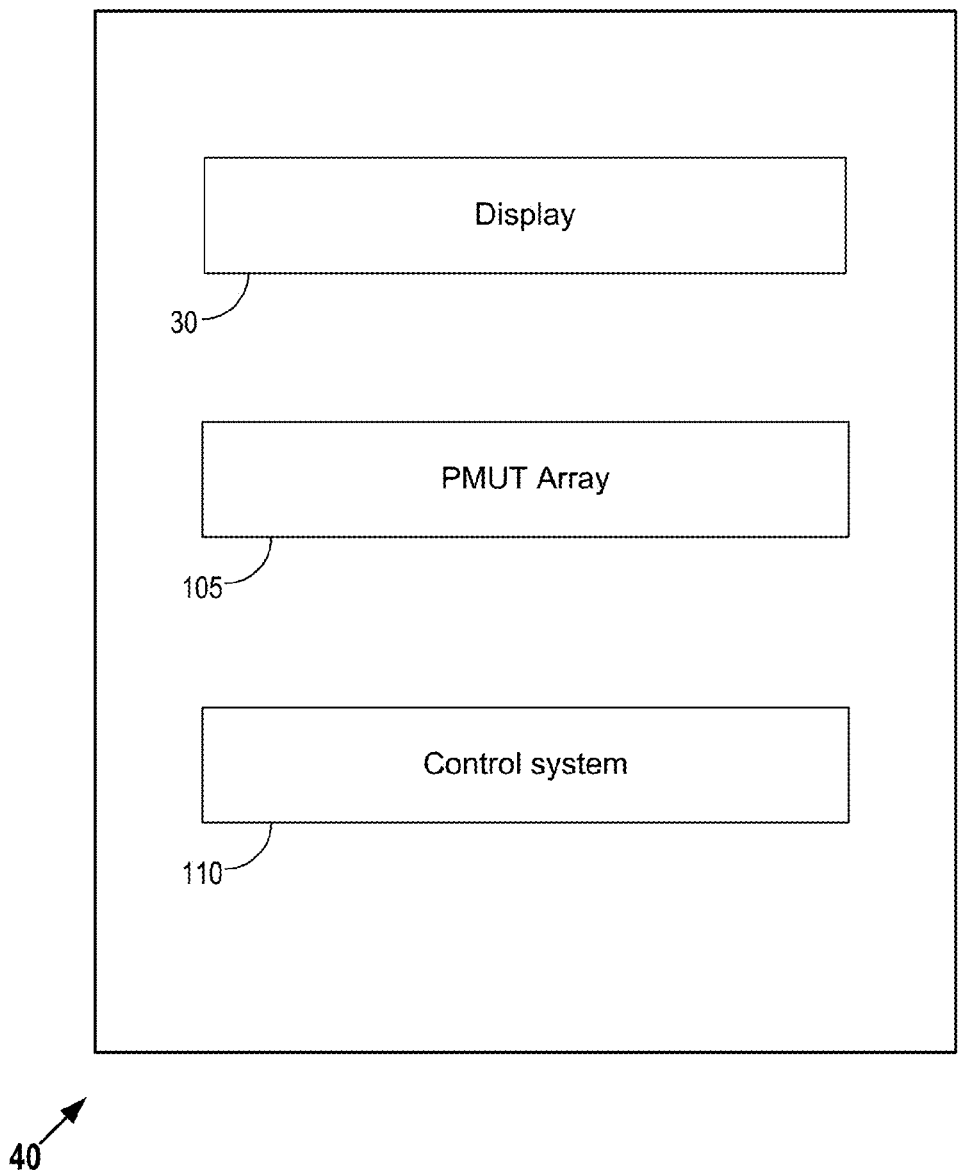
FIG. 1A is a block diagram that shows examples of elements of a display device.

The following description is directed to certain implementations for the purposes of describing the innovative aspects of this disclosure. However, a person having ordinary skill in the art will readily recognize that the teachings herein may be applied in a multitude of different ways. The described implementations may be implemented in any device, apparatus, or system that can be capable of displaying an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), mobile health devices, computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also may be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

It can be challenging to provide a gesture detection system and/or a fingerprint imaging system on a display device, particularly on a mobile display device. Capacitive touch systems (e.g., projected capacitive touch or PCT) are commonly included with a mobile display device. However, the resolution of capacitive touch screens is generally insufficient for fingerprint imaging or stylus detection. Moreover, the range of detection provided by capacitive touch screens is generally insufficient for gesture detection, because capacitive touch detection is typically limited to a few millimeters from the touchscreen surface.

Some implementations disclosed herein include an apparatus having a one- or two-dimensional array of piezoelectric micromechanical ultrasonic transducer (PMUT) elements positioned proximate (e.g., below, beside, on, or above) a backplane of a display. The backplane may, for example, be a thin-film transistor (TFT) backplane. The PMUT array or sub-arrays thereof may be configurable to operate in modes corresponding to multiple frequency ranges. When operating in the low-frequency mode, the apparatus may be capable of gesture detection. A high-frequency mode may, for example, be a fingerprint sensor mode, a stylus detection mode, or a touch detection mode. In some implementations, a portion of the PMUT elements of the PMUT array or sub-array may operate in a low-frequency mode, and a second portion of the PMUT array or sub-array may operate in a high-frequency mode. In some implementations, PMUT elements of the PMUT array may operate in either a low-frequency or high-frequency mode.

Particular aspects of the subject matter described in this disclosure can be implemented to realize one or more of the following potential advantages. Some implementations may provide a PMUT array capable of both gesture detection and fingerprint imaging. In some such implementations, the PMUT array may be capable of transmitting and receiving ultrasonic signals through at least a portion of an array of display pixels. Such implementations may reduce the peripheral area of a display device that is not occupied by the display. In some implementations, the PMUT array also may provide touch sensor functionality. In some such implementations, the touch screen normally provided with a display device may be omitted. However, in other implementations at least of a portion of the PMUT array, which may provide fingerprint sensor, signature pad, stylus detection, gesture detection and/or button functionality, may be located in a peripheral area.

Moreover, PMUT devices have generally been fabricated on a silicon or silicon-on-insulator (SOI) substrate with connections made to circuitry external to the substrate. Such configurations can limit the number of PMUT devices in an array, may require a large number of interconnects to the external circuitry, and can potentially add expense, packaging constraints, and loss in signal integrity. In some implementations provided herein, a PMUT array may be co-fabricated with TFT circuitry on the same substrate, which may reduce the number of interconnects to external circuitry and can potentially reduce expense and enhance signal integrity. Co-fabrication of PMUT elements with TFT circuitry allows large array sizes typical of mobile and stationary displays. Co-fabrication of PMUT elements and TFT circuitry on the same (e.g., common) substrate reduces the number of parts to assemble in a display device, and may reduce the total thickness of the display device. The number of external interconnects may be vastly reduced with large array sizes, as many of the interconnections between PMUT elements and TFT circuity may be done with metal traces on the TFT substrate.

A piezoelectric micromechanical ultrasonic transducer (PMUT) array may include one or more microstructures such as diaphragms, plates, membranes or ribbons that may be actuated piezoelectrically. A deposited thin-film piezoelectric layer and associated electrodes formed on, in or under the microstructure may serve to actuate the microstructure in one or more modes to generate ultrasonic waves. The ultrasonic waves may be used to detect free-space gestures in some implementations. In other implementations, the ultrasonic waves may be used to detect touches on the surface of a display device. Ultrasonic waves at higher frequencies (smaller wavelengths) may be used to detect a stylus or other small or finely featured object placed on the display surface. In some implementations, a high density (e.g., about 500 pixels per inch) of PMUT elements in an array of sufficient size may be used to detect a tip of a stylus and/or image the ridges and valleys of a fingerprint for verification or authentication of a user. The PMUT elements may be used as ultrasonic receivers, configured to detect ultrasonic waves that may be received after being reflected from an object in air or on the surface of the display. Many examples of PMUT arrays are provided in this disclosure and associated applications incorporated by reference into the present application. However, in some implementations a micromechanical ultrasonic transducer (MUT) array may include other types of MUT elements, such as capacitive micromechanical ultrasonic transducer (CMUT) elements. A further description of CMUTs and PMUT elements is described below with respect to FIGS. 1B and 1C.

FIG. 1A is a block diagram that shows examples of elements of a display device. In this example, the display device 40 includes a display 30, a PMUT array 105 and a control system 110. The PMUT array 105 may be proximate the display 30. In some implementations, the PMUT array 105 may be coextensive with the active display area and formed substantially in the same plane as the display sub-pixels (e.g., in-cell configurations). In some implementations, the PMUT array 105 may be substantially the same size as the display 30 yet positioned behind the active area of the display. In some implementations, at least a portion of the PMUT array 105 may be disposed behind substantially the entire display 30. In some implementations, the PMUT array 105 may be disposed behind only a portion of the display 30. Alternatively, or additionally, at least a portion of the PMUT array 105 may be disposed in a peripheral area of the display 30, such as an area outside the active display area of a display module. Numerous examples of these and other configurations are provided herein.

Portions of the PMUT array 105 disposed in a peripheral area of the display 30 may, for example, be controlled by the control system 110 to provide fingerprint sensor functionality, touchpad or signature (e.g., stylus) pad functionality, stylus detection functionality, gesture detection functionality and/or button functionality. The button functionality may involve controlling some aspect of the display device 40 with or without authentication functionality. Accordingly, such buttons may be referred to as "authenticating" buttons or "non-authenticating" buttons.

The PMUT array 105 may, for example, be a PMUT array or in some implementations a CMUT array. The control system 110 may include one or more processors, such as one or more general purpose single- or multi-chip processors, digital signal processors (DSPs), application specific integrated circuits (ASICs), field programmable gate arrays (FPGAs) or other programmable logic devices, discrete gate or transistor logic, such as TFTs, discrete hardware components, or combinations thereof. The control system 110 may be capable of performing the methods described herein, at least in part.

For example, the control system 110 may be capable of determining whether to operate at least a portion of the PMUT array 105 in a low-frequency mode or a high-frequency mode and controlling at least a portion of the PMUT array 105 according to the determination. Some implementations of the display device 40 may include an interface system. The determining process may be performed, at least in part, according to input received from the interface system. The interface system may, for example, include one or more network interfaces, user interfaces, etc. The interface system may include one or more universal serial bus (USB) interfaces or similar interfaces. The interface system may include wireless or wired interfaces.

Figure 2:
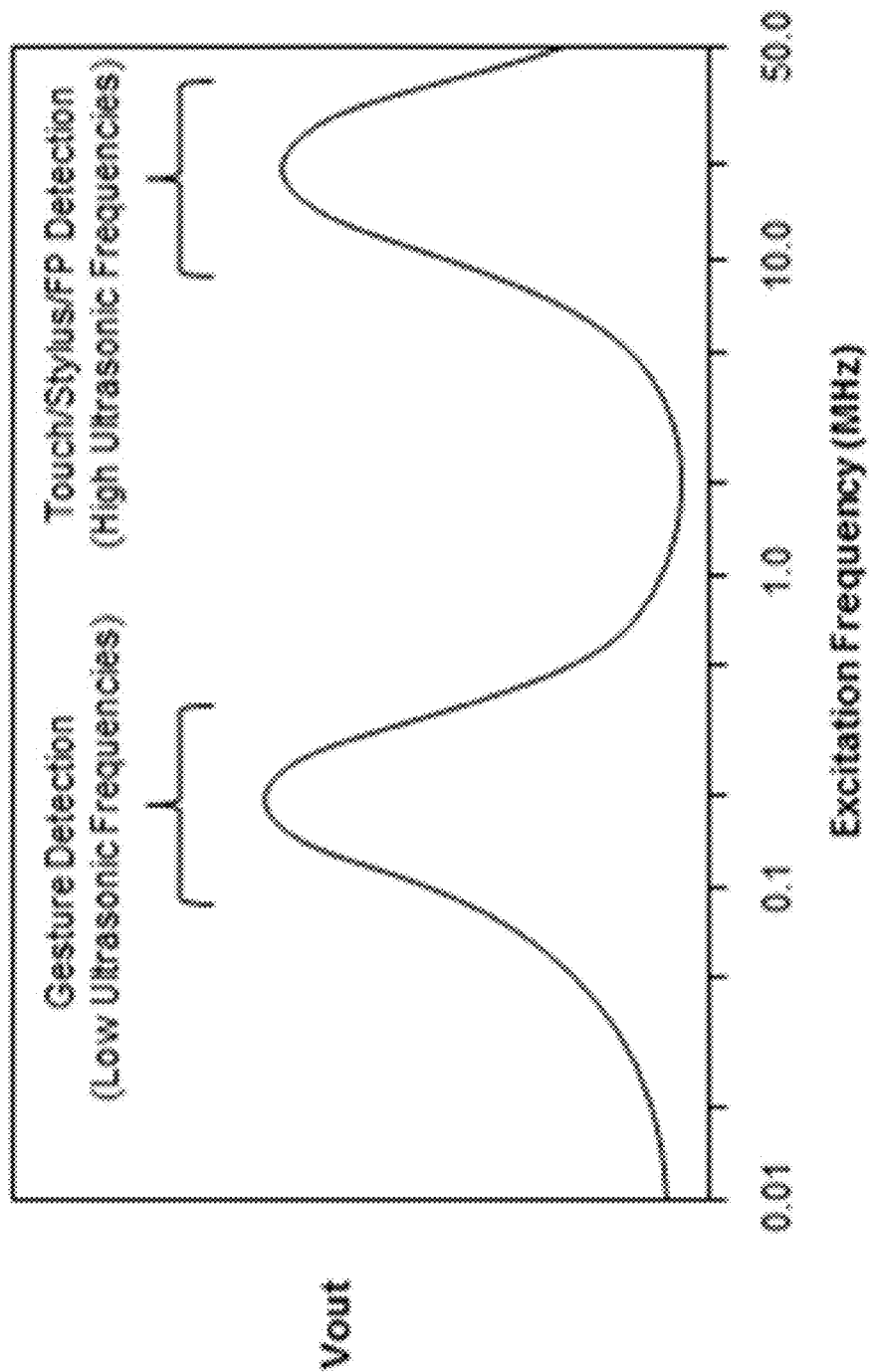
FIG. 2 is a graph that shows examples of frequency ranges for PMUT excitation.

FIG. 2 is a graph that shows examples of frequency ranges for PMUT excitation. In FIG. 2, the horizontal axis indicates potential excitation frequencies according to a logarithmic scale and the vertical axis corresponds to a typical output voltage (Vout) from one or more PMUT elements in a PMUT array. In this example, a low-frequency mode corresponds to a frequency range between approximately 50 kHz and 400 kHz and a high-frequency mode corresponds to a frequency range between approximately 5 MHz and 50 MHz. However, in alternative implementations, the low-frequency mode and/or the high-frequency mode may correspond to different frequency ranges. In some such implementations, the low-frequency mode may correspond to a frequency range of approximately 50 kHz to 200 kHz and the high-frequency mode may correspond to a frequency range of approximately 1 MHz to 25 MHz. Alternatively, or additionally, in some implementations, the PMUT array may be configurable to operate in a medium-frequency mode corresponding to a frequency range between the low-frequency range and the high-frequency range (e.g., about 200 kHz to about 1 MHz). When operating in the medium-frequency mode, the apparatus may be capable of providing touch sensor functionality and gesture detection capability, although with somewhat less resolution than the high-frequency mode.

Referring again to FIG. 1A, in some implementations when the control system operates at least a portion of the PMUT array 105 in the low-frequency mode, the display device 40 may be capable of emitting sound waves that are capable of relatively greater penetration into air than when the display device 40 is operating in the high-frequency mode. In some examples, such lower-frequency sound waves may be transmitted through various overlying layers, such as a cover glass, a touchscreen, a display array, a backlight, and/or other layers which may vary according to the implementation. In some implementations, the lower frequency sound waves may be transmitted through one or more holes in the cover glass or cover lens of the display device. Various configurations are disclosed herein.

In some implementations, a port may be opened through one or more of the overlying layers to optimize coupling from the PMUT array 105 into air. The lower-frequency sound waves may be transmitted through the air above the display surface, reflected from one or more objects near a surface of the display device 40, transmitted through the air and back through the overlying layers, and detected by an ultrasonic receiver (e.g., of the PMUT array 105). Accordingly, when operating in the low-frequency mode, the display device 40 may be capable of operating in a gesture detection mode, wherein free-space gestures near the display may be detected.

When operating in the high-frequency mode, the display device 40 may be capable of imaging at relatively higher resolution. Accordingly, the display device 40 may be capable of detecting touch, fingerprint, stylus, and/or biometric information from an object such as a finger placed on the surface of the display device 40. In some implementations, the high-frequency mode may correspond to a touch detection mode and/or a stylus detection mode. In some implementations, the high-frequency mode may correspond to a fingerprint sensor mode.

In some instances the control system 110 may be capable of performing an authentication process based, at least in part, on fingerprint data acquired while at least a portion of the PMUT array 105 operates in the fingerprint sensor mode. The authentication process may involve providing a prompt, via the display, to place at least one finger on a surface of the display device and receiving, via at least a portion of the PMUT array 105, at least one fingerprint image. In some implementations, the portion of the PMUT array 105 that the control system 110 controls to obtain the fingerprint image(s) may be disposed in a peripheral area of the display device 40, such as on an edge, side or corner of the display 30.

The control system 110 may be capable of determining received fingerprint data corresponding to the received fingerprint image(s). The term "fingerprint data" as used herein includes data that may be used to characterize fingerprint minutiae, such as data corresponding to the types, locations, orientations and/or spacing of fingerprint minutiae. Fingerprint data may also include pattern or image information of surface fingerprints and other biometric data associated with sub-surface features.

The control system 110 may be capable of comparing the received fingerprint data with stored fingerprint data as part of the authentication process. In some implementations, the stored fingerprint data may be stored in a memory system of the display device 40. The memory system may include one or more non-transitory media, such as random access memory (RAM) and/or read-only memory (ROM). The memory system may include one or more other suitable types of non-transitory storage media, such as flash memory, one or more hard drives, etc. In some implementations, an interface system may include at least one interface between the control system 110 and the memory system. However, in some implementations the authentication process may involve retrieving stored fingerprint data from another device via the interface system. For example, the stored fingerprint data may reside on a server accessible via the Internet.

In some implementations, the control system 110 may be capable of controlling the PMUT array 105 to operate in a medium-frequency mode. In some implementations, the medium-frequency mode may correspond to operation in a frequency range of approximately 200 kHz to 1 MHz. The display device 40 may be capable of providing touch sensor functionality when the control system 110 is controlling at least a portion of the PMUT array 105 to operate in the medium-frequency mode. According to some implementations, the control system 110 may be capable of determining whether to operate at least a portion of the PMUT array 105 in the high-frequency mode, the low-frequency mode or the medium-frequency mode and controlling at least a portion of the PMUT array 105 to operate in the high-frequency mode, the low-frequency mode or the medium-frequency mode, according to the determination.

In some implementations, the control system 110 may be capable of addressing at least a portion of the PMUT array 105 for wavefront beam forming, beam steering, receive-side beam forming, and/or selective readout of returned signals. In some implementations, the control system 110 may control an array of transmitters of the PMUT array 105 to produce wavefronts of a particular shape, such as planar, circular (spherical) or cylindrical wave fronts. The control system 110 may control the magnitude and/or phase of the array of transmitters of the PMUT array 105 to produce constructive or destructive interference in desired locations. For example, the control system 110 may control the magnitude and/or phase of the array of transmitters to produce constructive interference in one or more locations of the display device 40 in which a touch or gesture has been detected.

The generation and emission of planar ultrasonic waves (e.g., plane waves) may be achieved by exciting and actuating a large number of PMUT elements in the PMUT array 105 in a simultaneous manner, which may generate an ultrasonic wave with a substantially planar wavefront. Actuation of single PMUT elements in the PMUT array 105 may generate substantially spherical waves in a forward direction, with the PMUT element serving as the source of the spherical waves. Alternatively, the spherical waves may be generated by selecting and exciting an individual PMUT element (the center element), determining a first ring of PMUT elements around the center PMUT element and actuating the first ring in a delayed manner, determining a second ring of PMUT elements around the first ring and actuating the second ring in a further delayed manner, and so forth as needed. The timing of the excitations may be selected to form a substantially spherical wavefront. Similarly, a cylindrical wave may be generated by selecting and exciting a group of PMUT elements in a row, with the row of PMUT elements serving as the source of the cylindrical waves. Alternatively, the cylindrical waves may be generated by selecting and exciting a row of PMUT elements (the center row), determining and exciting adjacent rows of PMUT elements equidistant from the center row with a controlled time delay, and so forth. The timing of the excitations may be selected to form a substantially cylindrical wavefront.

While exciting an array of PMUT elements simultaneously may produce an ultrasonic plane wave traveling perpendicular to the PMUT array, phase control of PMUT excitation may allow redirection of the plane wave in various directions, depending on the amount of phase delay. For example, if a phase delay of 10 degrees is applied to adjacent rows of PMUT elements that are positioned a distance of one-tenth of a wavelength apart, then the wavefront will transmit a plane wave at an angle of about 15.5 degrees from the normal. Scanning a plane wave at different angles while detecting echoes (reflected portions) from an object positioned in front of the PMUT array may allow detection of the approximate shape, distance and position of the object. Consecutive determinations of object distance and position may allow determination of air gestures.

Other forms of transmit-side beam forming may be utilized. For example, a set of PMUT elements in the PMUT array 105 may be fired in a manner to focus the wavefront of an ultrasonic wave at a particular location in front of the array. For example, the focused wavefront may be cylindrical or spherical by adjusting the timing (e.g., phase) of selected PMUT elements so that the generated wave from each selected PMUT element arrives at a predetermined location in the region in front of the PMUT array at a predetermined time. Focused wavefronts may generate appreciably higher acoustic pressure at a point of interest, and the reflected signal from an object at the point of interest may be detected by operating the PMUT array in a receive mode. The wavefronts emitted from various PMUT elements may interfere constructively in the focal region. The wavefronts from various PMUT elements may interfere destructively in regions near the focal region, providing further isolation of the focused beam energy (amplitude) and increasing the signal-to-noise ratio of the return signal. Similarly, control of the phase at which detection occurs for various PMUT elements in the PMUT array 105 allows receive-side beam forming, in which the return signals may be correlated with distance from a region in space and combined accordingly to generate an image of an object in the detection region. Controlling the frequency, amplitude and phase of the transmitted waves from PMUT elements in the PMUT array 105 may also allow beam shaping and beam forming. In some implementations, not all of the PMUT elements in the PMUT array need be read out for each mode of operation or for each frame. To save processing time and reduce drain on battery life, return signals detected by a select group of PMUT elements may be read out during acquisition. The control system 110 may be configured to address a portion of the PMUT array for wavefront beam forming, beam steering, receive-side beam forming, or selective readout of returned signals.

In some implementations, the PMUT array 105 may include one or more active matrix PMUT arrays. In such implementations, the active matrix PMUT arrays can eliminate the large number of external interconnects that may be required for passive PMUT arrays by including active components (e.g., TFTs) on the same substrate. Such active components may be part of the control system 110. Some such active matrix PMUT arrays may include both drive circuitry and sense circuitry. In some such implementations, the TFTs may be capable of driving the PMUT elements of the PMUT array 105 in a synchronous manner. Alternatively, or additionally, in some implementations the TFTs may be capable of driving the PMUT elements of the PMUT array 105 in a phased manner. The active matrix also may include sense circuitry to detect return signals from the PMUT elements of the PMUT array 105.

In some examples, the control system 110 may include row and column addressing circuitry. In some implementations, the control system 110 may include multiplexer and/or demultiplexer circuitry, local amplification circuitry, analog to digital (A/D) conversion circuitry and/or other control circuitry.

Figure 1B:
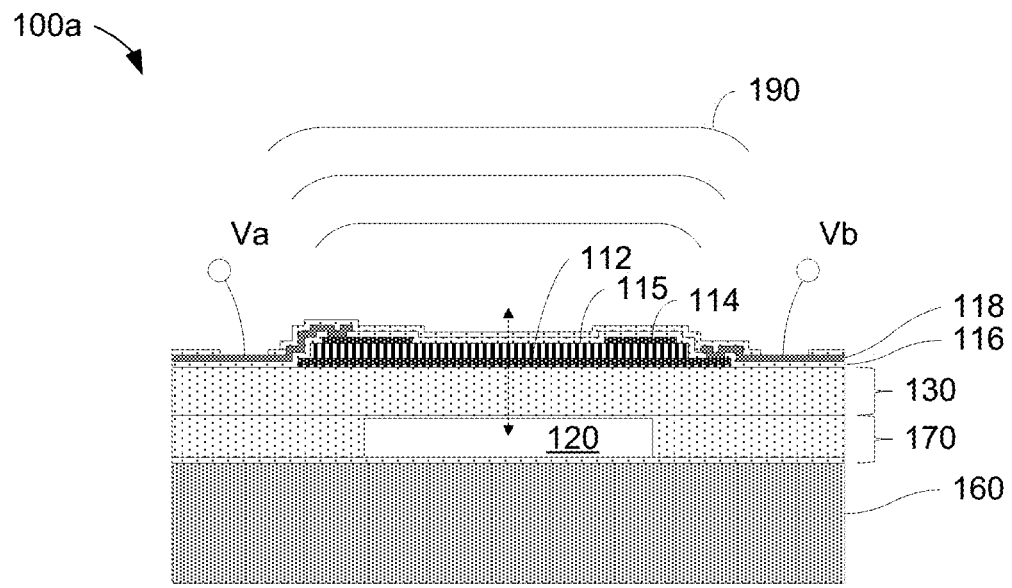
FIG. 1B shows an example of a PMUT element.

FIG. 1B shows an example of a PMUT element. The PMUT element 100a may have one or more layers of piezoelectric material such as aluminum nitride (AlN) or lead zirconium titanate (PZT) in a piezoelectric layer that may be used to actuate the PMUT element to generate ultrasonic waves or to detect received ultrasonic waves. The piezoelectric layer stack may include a lower electrode layer 112, a piezoelectric layer 115, and an upper electrode layer 114, with the piezoelectric layer 115 sandwiched between at least a portion of the lower and upper electrodes 112 and 114. One or more dielectric layers 116 may provide electrical isolation for a metal interconnect layer 118, while allowing connections to lower and upper electrodes 112 and 114, respectively. The piezoelectric layer stack may be disposed on, below or above a mechanical layer 130. An anchor structure 170 may support the PMUT membrane or diaphragm that is suspended over a cavity 120 and a substrate 160. The substrate 160 may have TFT circuitry for driving and sensing the PMUT 100a and for generating a visual display. The piezoelectric layer stack and mechanical layer 130 may flex, bend or vibrate in response to drive voltages Va and Vb applied across the electrode layers 114 and 112, respectively. Vibrations of the PMUT element 100a may generate ultrasonic waves 190 at a frequency determined by the excitation frequency of the drive voltages. Ultrasonic waves striking the PMUT diaphragm may result in generation of sense voltages Va and Vb with flexing of the diaphragm. An underlying cavity 120 allows for deflections of the PMUT element 100a without contacting the underlying substrate 160. The operating frequencies of the PMUT elements 100a may be tailored for high-frequency operation, low-frequency operation, medium-frequency operation, or a combination of frequencies.

Figure 1C:
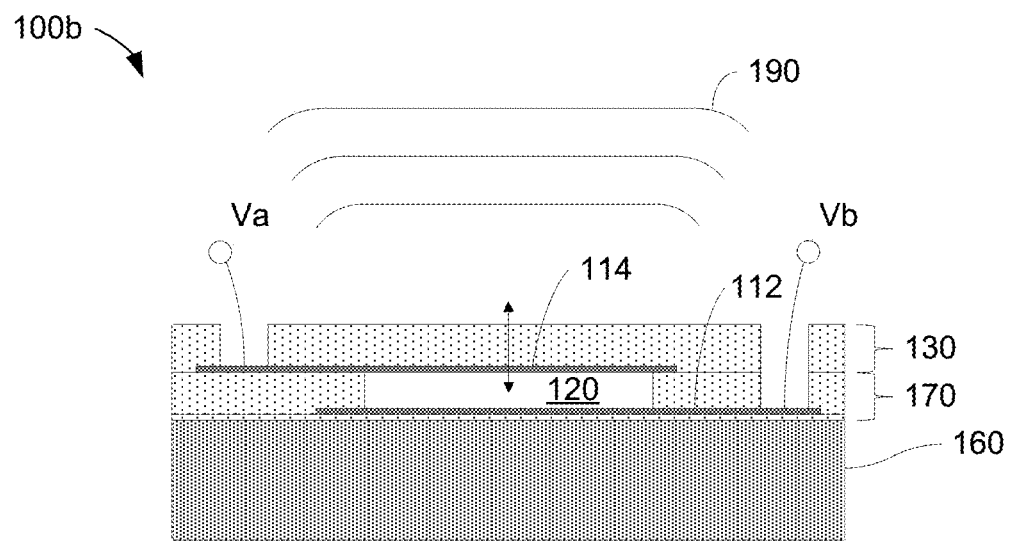
FIG. 1C shows an example of a CMUT element.

FIG. 1C shows an example of a CMUT element. The CMUT element 100b may have a mechanical layer 130 supported above a cavity 120 and a substrate 160 by an anchor structure 170. Lower electrode 112 on the substrate below the cavity and upper electrode 114 above the cavity 120 may be driven with an excitation voltage applied to terminals Va and Vb to generate ultrasonic waves 190. A potential difference between electrodes 112 and 114 causes an electrostatic force to be generated that attracts the flexible diaphragm of CMUT element 100b downwards towards the substrate. As electrostatic forces are attractive in this configuration whether Va is larger than Vb or Vb is larger than Va, one of the electrodes may need to be biased at a relatively high DC voltage to allow small applied AC voltages to drive the diaphragm up and down. Biasing is also required for sensing deflections of the CMUT diaphragm above the cavity 120.

PMUT element 100a, while somewhat more complex to fabricate than CMUT element 100b, generally requires smaller operating voltages than the CMUT element 100b to generate similar acoustic power. The PMUT element 100a does not suffer from consequential pull-in voltages for electrostatic devices such as CMUT element 100b, allowing a fuller range of travel. Furthermore, CMUT elements 100b may require significantly higher bias voltages to allow detection of incoming ultrasonic waves.

Figure 3A:
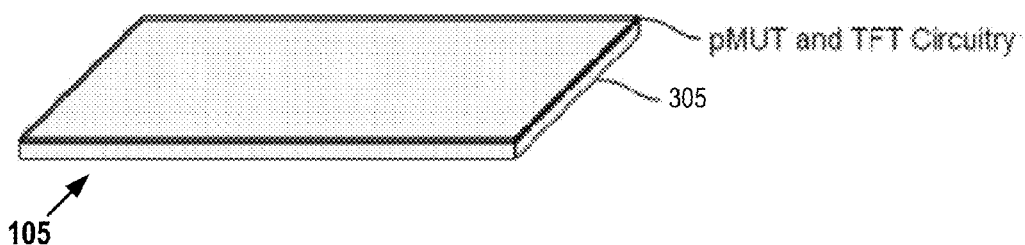
FIG. 3A shows an example of a PMUT array.

FIG. 3A shows an example of a PMUT array. In this example, the PMUT array 105 has been co-fabricated with TFT circuitry on the same substrate 305, which may be a glass or plastic substrate in some implementations. The TFT circuitry may be part of the control system 110 of FIG. 1A.

The TFT circuitry may include row and column addressing electronics, multiplexers, local amplification stages and control circuitry. In some examples, at least one array of TFTs includes circuitry for controlling the display. According to some implementations, at least one array of TFTs that includes circuitry for controlling the display may be disposed on a second substrate. In some implementations, at least one array of TFTs includes circuitry for controlling at least a portion of the PMUT array 105. According to some such implementations, the circuitry for controlling at least a portion of the PMUT array and the circuitry for controlling the display may be capable of sharing a flex cable.

Figure 3B:
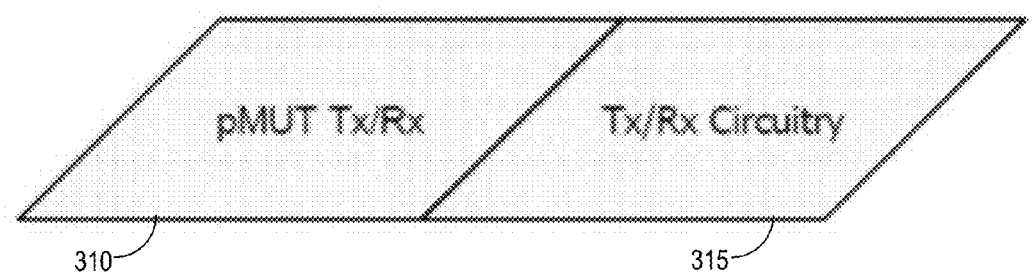
FIGS. 3B-3F show various examples of TFT circuitry elements and PMUT elements.

FIGS. 3B-3F show various examples of TFT circuitry elements and PMUT elements. FIG. 3B shows a single PMUT element 310, which is a pMUT element in this instance. A PMUT array, such as the PMUT array 105 of FIG. 3A, may include multiple instances of the PMUT element 310 and/or of other types of PMUT elements disclosed herein. In some examples, as described in more detail elsewhere herein, at least some of the PMUT elements 310 of a PMUT array 105 may correspond with individual pixels of a display 30.

In the example shown in FIG. 3B, the PMUT element 310 may be configured as both a transmitting element (Tx) and a receiving element (Rx). In this implementation, the TFT circuitry element 315 may include a driver stage and a sense stage. Accordingly, in this example the TFT circuitry element 315 is capable of causing the PMUT element 310 to emit ultrasonic waves. Moreover, in this example the TFT circuitry element 315 is capable of detecting responses from the same PMUT element 310, corresponding to ultrasonic waves sensed by the PMUT element 310.

Figure 3C:
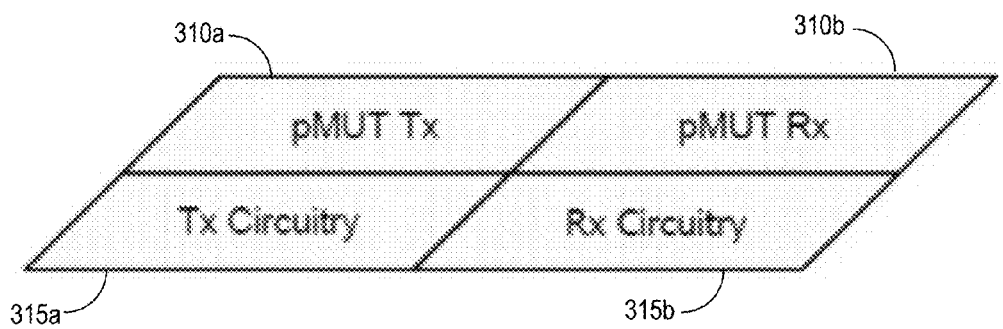
Figure 3D:
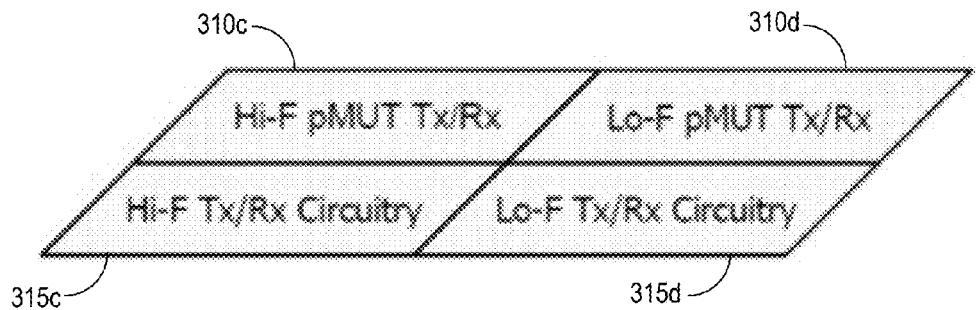
Figure 3E:
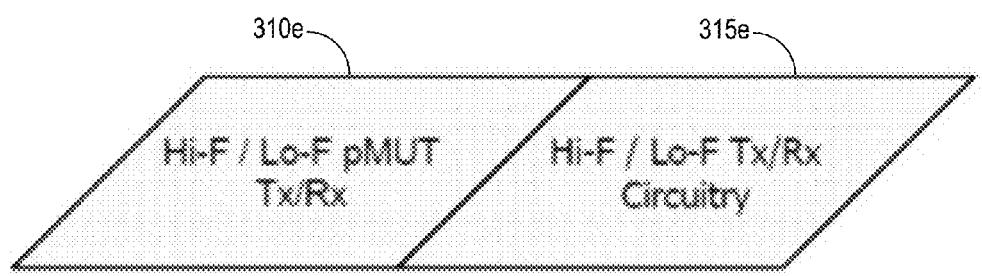

In the implementation shown in FIG. 3C, the PMUT element 310a is capable of functioning as an acoustic transmitter and a second PMUT element 310b is capable of functioning as an acoustic receiver. In this example, the TFT circuitry element 315a is capable of controlling the PMUT element 310a and the TFT circuitry element 315b is capable of providing signals corresponding to ultrasonic waves sensed by the PMUT element 310b.

In some configurations, different PMUT elements 310 of the PMUT array 105 may be capable of low- and high-frequency operation (e.g. for gestures and for fingerprint/stylus detection). In the example shown in FIG. 3D, the PMUT element 310c is capable of functioning as a high-frequency (Hi-F) acoustic transmitter and receiver, and the PMUT element 310d is capable of functioning as a low-frequency (Lo-F) acoustic transmitter and receiver. Although in FIG. 3D the PMUT element 310c and the PMUT element 310d are shown to be approximately the same size, in some examples the PMUT element 310c may be smaller than the PMUT element 310d. In this implementation, the TFT circuitry element 315c is capable of controlling the PMUT element 310c for high-frequency operation and TFT circuitry element 315d is capable of controlling the PMUT element 310d for low-frequency operation.

In other configurations, the same PMUT element 310 may be used for low- and high-frequency operation. In the example shown in FIG. 3E, the PMUT element 310e is capable of functioning as a high-frequency acoustic transmitter and receiver, and as a low-frequency acoustic transmitter and receiver. In this implementation, the TFT circuitry element 315e is capable of controlling the PMUT element 310e for high-frequency operation and for low-frequency operation. In one mode of operation, the TFT circuitry element 315e may control the PMUT element 310e to operate in either a high-frequency mode (e.g., for touch, stylus or fingerprint detection) or a low-frequency mode (e.g., for gesture or low-resolution touch detection). In another mode of operation, the TFT circuitry element 315e may control the PMUT element 310e to operate in an alternating mode, flipping at a relatively high rate (e.g. at a frame rate between about 5 and about 240 frames per second) between high-frequency and low-frequency modes. In another mode of operation, the PMUT element 310e may be excited with a drive signal having a high-frequency component and a low-frequency component, so that low-resolution gestures and high-resolution fingerprint imaging may be performed at the same time. Electronic filtering may be used to distinguish the return signals at the various frequencies.

Figure 3F:
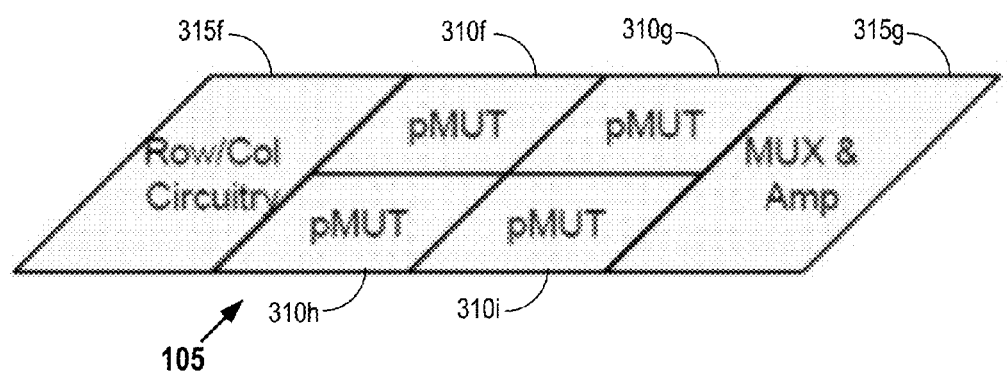

FIG. 3F shows an example of a PMUT array 105. The PMUT array 105 shown in FIG. 3F may, for example, be a PMUT sub-array that is a portion of a larger PMUT array 105. In this example, the PMUT array 105 includes the PMUT elements 310f-310i. Here, the TFT circuitry element 315f includes row and column addressing electronics for controlling the PMUT elements 310f-310i. In this example, the TFT circuitry element 315g includes multiplexer circuitry and local amplification circuitry.

Figure 4:
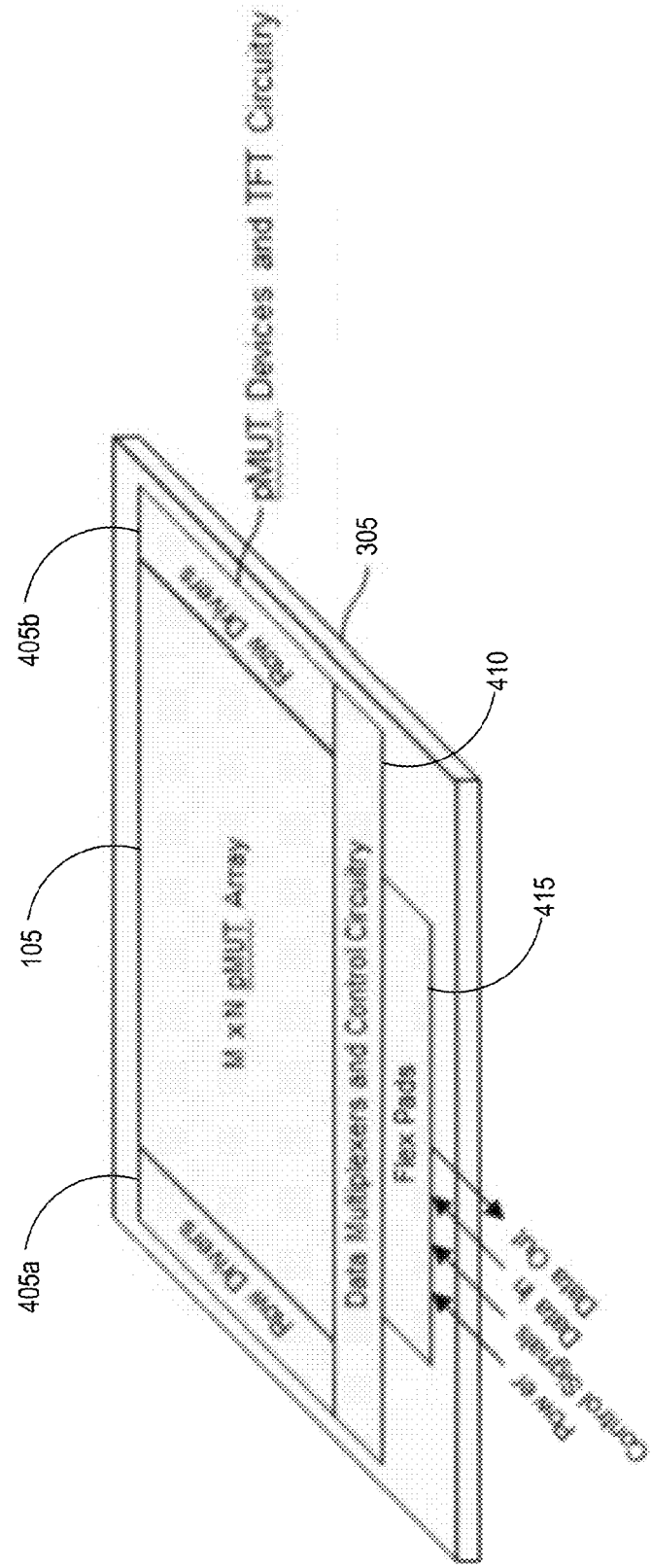
FIG. 4 shows another example of active components and a PMUT array on the same substrate.

FIG. 4 shows another example of active components and a PMUT array on the same substrate. In this example, the PMUT array 105 and TFT circuitry are both provided on the common substrate 305, which may be glass or plastic in some implementations. Here, the TFT circuitry includes row drivers 405a and 405b, as well as data multiplexer and control circuitry 410. Here, the row drivers 405a and 405b are capable of addressing individual rows of the PMUT array 105. In some examples, the TFT circuitry may be capable of addressing individual columns, rows, PMUT elements 310 and/or groups of PMUT elements 310 of the PMUT array 105.

In this example, an array of flex pads 415 may provide connectivity with other components of a device. According to some implementations, the components shown in FIG. 4 are part of a display device, such as the display device 40 of FIG. 1A. Accordingly, the TFT circuitry shown in FIG. 4 may be part of the control system 110 of FIG. 1A. In some implementations, the control signals and/or data being input via the flex pads 415 may be sent from the control system 110, and the data being output via the flex pads 415 may be sent to the control system 110, e.g., via a flex cable. In some examples, the TFT circuitry and the circuitry for controlling the display may be capable of sharing a flex cable connected to the flex pads 415. In some implementations, the TFT circuitry (and/or other components of the control system 110) may be capable of addressing at least a portion of the PMUT array 105 for wavefront beam forming, beam steering, receive-side beam forming, and/or selective readout of returned signals.

Figure 5A:
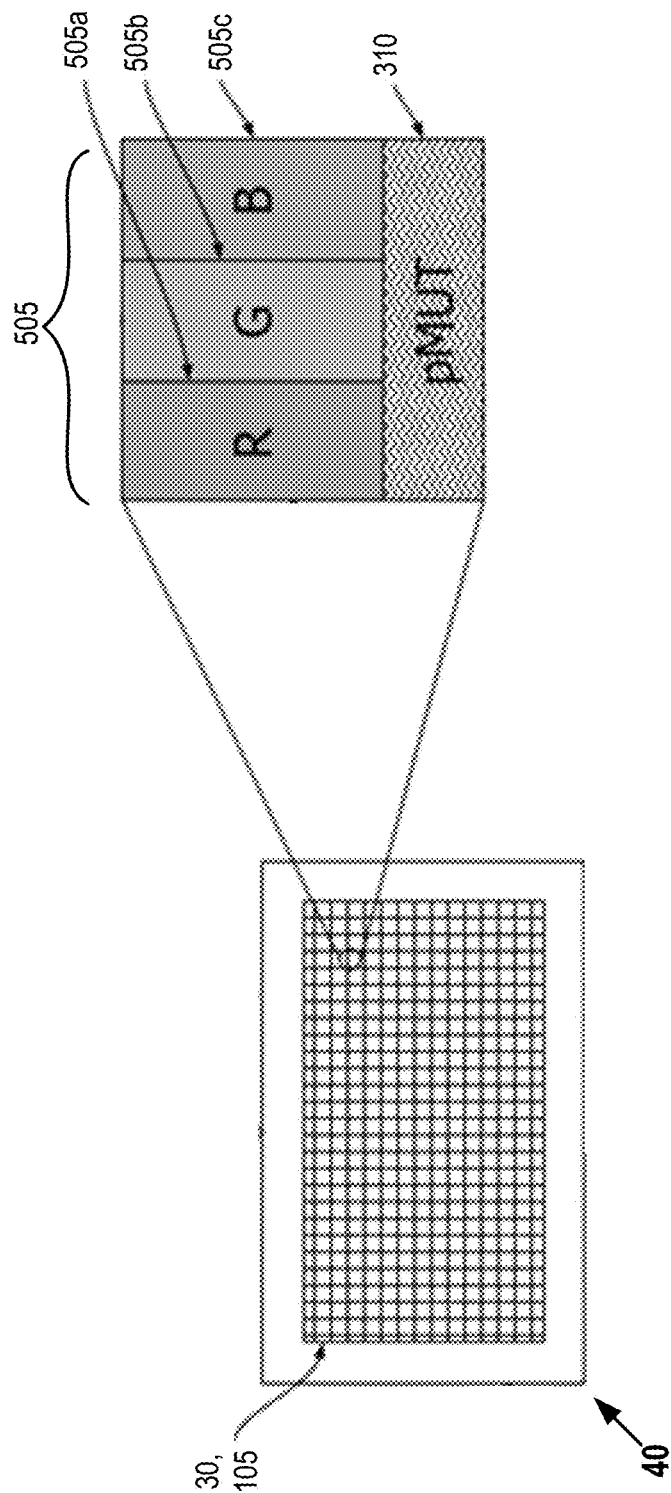
FIG. 5A shows an example of a display device that includes a PMUT array.

FIG. 5A shows an example of a display device that includes a PMUT array. In this example, a single display pixel 505 of the display device 40 corresponds to a single PMUT element 310 of the PMUT array 105. Such implementations may be referred to herein as "in-cell" implementations. In some implementations, a PMUT element 310 may correspond with each display pixel 505 in the display 30. In some implementations, PMUT elements 310 may be positioned in a portion of the display pixels 505 or in select areas of the display 30 such as near a corner or edge of the active display area.

In this example, the display pixel 505 includes a red subpixel 505a, a green subpixel 505b and a blue subpixel 505c. Other in-cell implementations may include display pixels 505 with different numbers and/or colors of subpixels. Still other in-cell implementations may have display pixels 505 that do not include subpixels, such as multi-state IMOD pixels, each of which can provide a range of colors.

In some high-resolution implementations of the display device 40, the display 30 may include pixels 500 having a spacing or pitch of 50 microns, which is approximately 500 dots or pixels per inch. In order to have a sufficiently high resolution for fingerprint detection, fingerprint sensor arrays also may need to have a spacing on the order of 500 dots or pixels per inch. Accordingly, some in-cell implementations of a display device 40, such as that shown in FIG. 5A, may provide a high-resolution display 30 and a PMUT array 105 having a sufficiently high resolution for fingerprint sensor functionality.

In the in-cell implementation shown in FIG. 5A, the PMUT elements 310 of the PMUT array 105 are positioned in substantially the same plane as the display subpixels, such that a portion of the display area is utilized by the PMUT elements. In such implementations, it is desirable for the PMUT elements 310 to be non-transparent or substantially non-transparent. In other in-cell implementations, a portion or all of each PMUT element 310 of the PMUT array 105 may be positioned over or under one or more display subpixels of the display pixels 505. In such implementations, it is desirable for the PMUT elements 310 to be transparent, or substantially transparent.

Figure 5B:
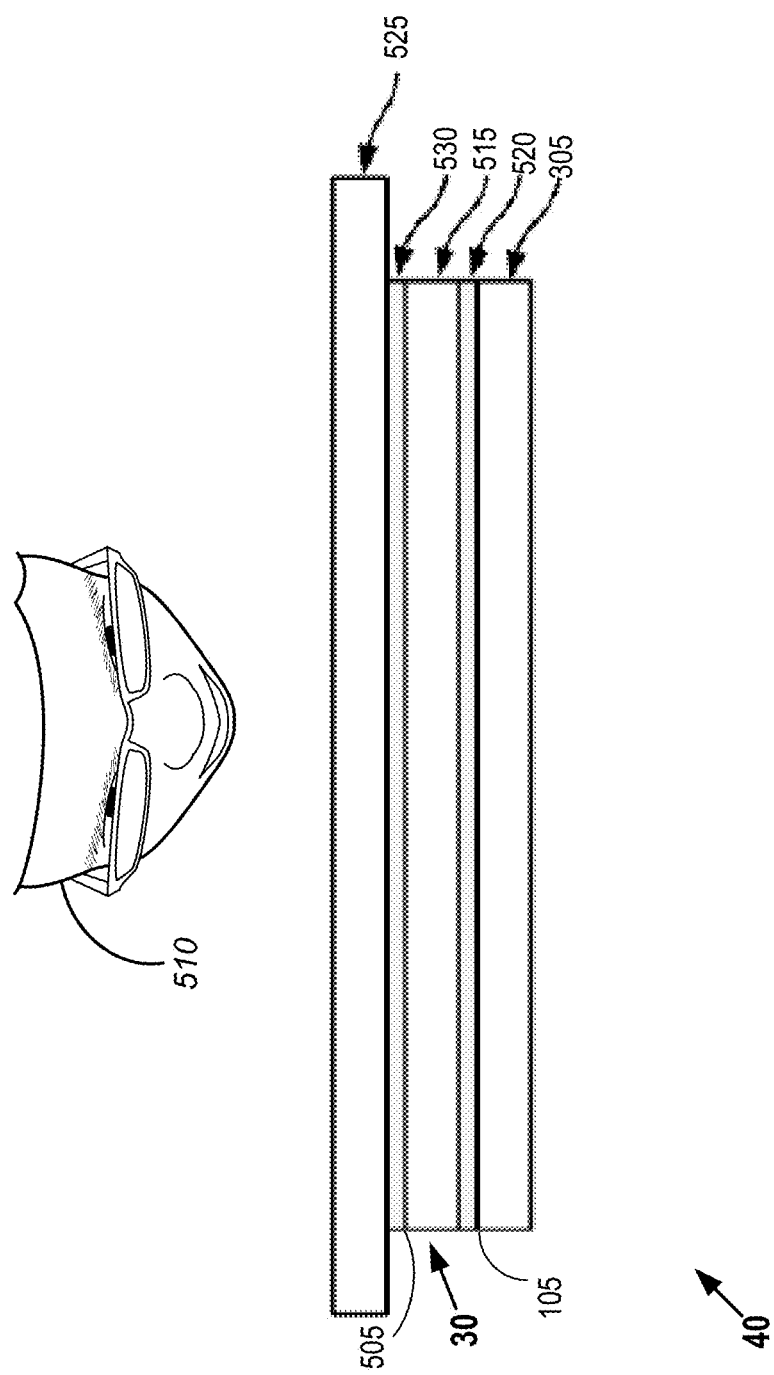
FIG. 5B shows an example of a display device having a PMUT array that is co-extensive with an array of display pixels.

According to some implementations, at least a portion of the PMUT array 105 may be disposed behind substantially all of the display 30. FIG. 5B shows an example of a display device having a PMUT array that is co-extensive with an array of display pixels. In this example, the PMUT array 105 is positioned behind the display 30: the display pixels 505 are between the PMUT elements 310 and a viewer 510. In this example, the PMUT array 105 is disposed on the substrate 305, which may be formed of any suitable material. For implementations in which light will be transmitted through the substrate 305 (e.g., if the substrate 305 is positioned between the display 30 and a backlight panel), the substrate 305 may be a glass, plastic or another transparent or substantially transparent material. However, if it is not necessary for light to be transmitted through the substrate 305 (e.g., if the substrate 305 is positioned below a backlight panel or if the display 30 is an emissive display, such as an organic light-emitting diode (OLED) display), the substrate 305 need not be formed of a transparent or substantially transparent material. Here, the display 30 includes an array of display pixels 505 on a substrate 515, which may be a glass or plastic substrate in some implementations.

The PMUT array 105 may include various types of PMUT elements 310, depending on the particular implementation. In some implementations, the PMUT array 105 may include PMUT elements 310 configurable as low-frequency emitters and/or receivers for ultrasonic gesture detection. In some implementations, the PMUT array 105 may include PMUT elements 310 configurable as high-frequency emitters and/or receivers, e.g., for ultrasonic fingerprint, stylus and/or other biometric detection. In some implementations, the PMUT array 105 may include PMUT elements 310 configurable as both low-frequency and high-frequency emitters and/or receivers, e.g., for gesture detection and biometric sensing. In some configurations, the PMUT array 105 may include PMUT elements 310 that are capable of button functionality, which may be authenticating button functionality and/or non-authenticating button functionality. In some implementations, the PMUT array 105 may include PMUT elements 310 configurable to operate in a medium-frequency mode. When operating in a medium-frequency mode, the display device 40 may be capable of providing gesture detection capability and/or touch sensor functionality, although with somewhat less resolution than operation in low-frequency or high-frequency modes.

In the example shown in FIG. 5B, the substrate 305 and the substrate 515 may be joined via a coupling agent 520. Here, the substrate 515 and the cover glass 525 are joined via an adhesive 530. The coupling agent 520 may include silicone, an adhesive such as epoxy, a pressure-sensitive adhesive (PSA), or other material with suitable acoustic and optical properties. For example, the coupling agent 520 may have a small or substantially zero acoustic impedance mismatch with the substrate 305 and the substrate 515. Similarly, the adhesive 530 may have a small acoustic impedance mismatch with the substrate 515 and the cover glass 525. Preferably, there are substantially no air gaps between the PMUT array 105 and the cover glass 525.

Figure 5C:
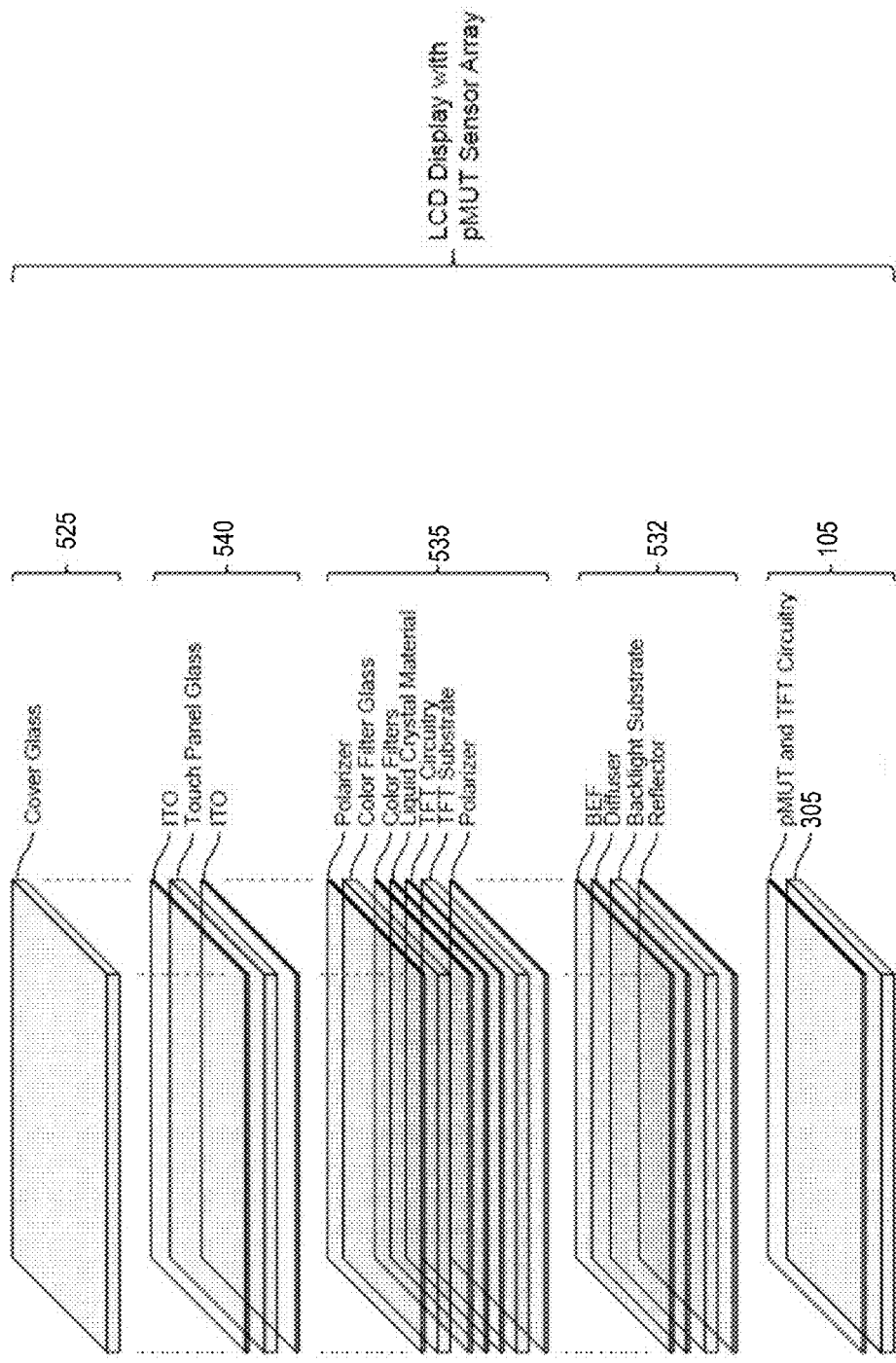
FIG. 5C shows an example stack for a display device that includes an LCD display and a PMUT array.

FIG. 5C shows an example stack for a display device that includes an LCD display and a PMUT array. For the sake of simplicity, the adhesive layers of the stack are not shown. Here, the display device 40 may include a PMUT array 105, a backlight panel 532, an LCD display module 535, a touch panel 540 and a cover glass 525.

In this example, the PMUT array 105 may include a pMUT array and TFT circuitry on a substrate 305. Here, the backlight panel 532 includes a backlight substrate, a reflector film, a diffuser film and a brightness enhancement film (BEF). In this implementation, the LCD display module 535 includes polarizing layers, a TFT substrate, TFT circuitry, liquid crystal material, color filters and a color filter glass. In this example, the touch panel 540 includes a touch panel substrate, which is formed of glass in this instance, as well as transparent electrode layers, which are indium tin oxide (ITO) layers in this implementation. In some implementations, the TFT circuitry for controlling the PMUT array 105 and the TFT circuitry for controlling the LCD display module 535 may be capable of sharing a flex cable.

Figure 5D:
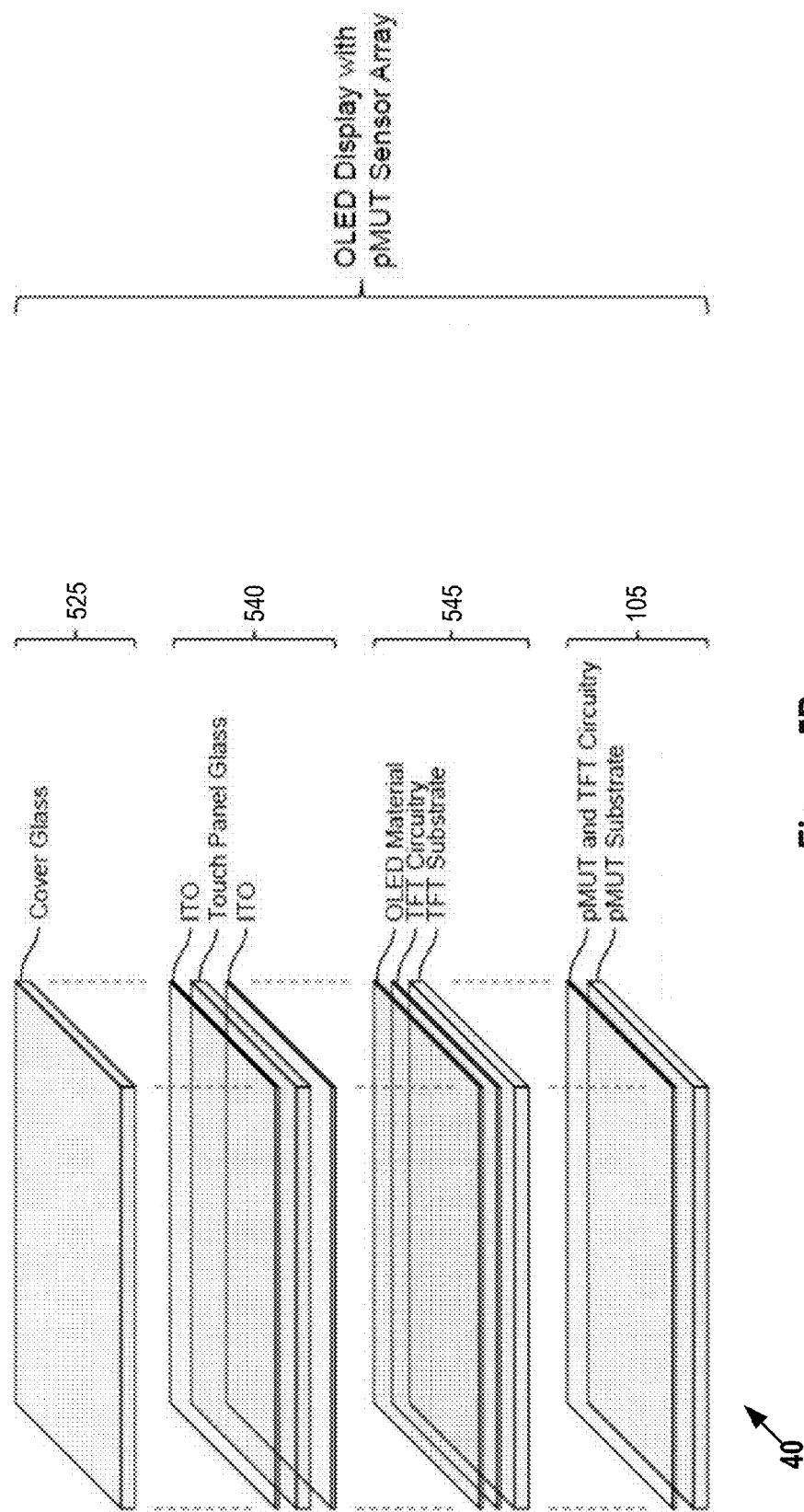
FIG. 5D shows an example stack for a display device that includes an OLED display and a PMUT array.

FIG. 5D shows an example stack for a display device that includes an OLED display and a PMUT array. In this example, the stack is substantially simpler than that shown in FIG. 5C. The OLED display module 545, which includes a TFT substrate, TFT circuitry and OLED material, is substantially simpler than the LCD display module 535 shown in FIG. 5C. Moreover, because the OLED display module 545 is an emissive display module, no backlight panel is required. In some implementations, the TFT circuitry for controlling the PMUT array 105 and the TFT circuitry for controlling the OLED display module 545 may be capable of sharing a flex cable.

As noted above, having a "full-size" PMUT array 105 that is co-extensive with an array of display pixels can provide various potential advantages. However, a full-size PMUT array 105 attached to the back of a display 30 can add substantially to expense and increase the display device thickness.

According to some implementations, at least a portion of the PMUT array 105 may be disposed behind only a part of the display 30. FIG. 6A shows an example of a display device that includes a PMUT array behind only a portion of a display. The elements shown in FIG. 6A are substantially similar to those shown in FIG. 5B. However, in the example of FIG. 6A, the area 605 occupied by the PMUT array 105 is substantially smaller than the area 610 occupied by the display 30.

In some implementations, the PMUT array 105 may include PMUT elements 310 configurable as high-frequency emitters and/or receivers, e.g., for ultrasonic fingerprint, stylus and/or other biometric detection. In some such implementations, the PMUT array 105 may correspond to a fingerprint sensor area or ultrasonic touchpad area of the display device 40. In some implementations, the PMUT array 105 may include PMUT elements 310 configurable as low-frequency emitters and/or receivers for ultrasonic gesture detection. In some such implementations, the display device 40 may include multiple areas 605, each of which corresponds to a PMUT array 105. In some implementations, the PMUT array 105 may include PMUT elements 310 configurable as both low-frequency and high-frequency emitters and/or receivers, e.g., for gesture detection and biometric sensing. In some implementations, the PMUT array 105 may include PMUT elements 310 configurable to operate in a medium-frequency mode, e.g., for lower resolution gesture detection and/or touch sensor functionality.

According to some implementations, at least a portion of the PMUT array 105 may be disposed in a peripheral area of the display 30. A control system, such as the control system 110 of FIG. 1A, may be capable of controlling a portion of the PMUT array 105 that is disposed in the peripheral area of the display 30 for biometric sensor functionality (such as fingerprint sensor functionality), touchpad or signature (e.g., stylus) pad functionality, gesture detection functionality and/or button functionality.

Figure 6B:
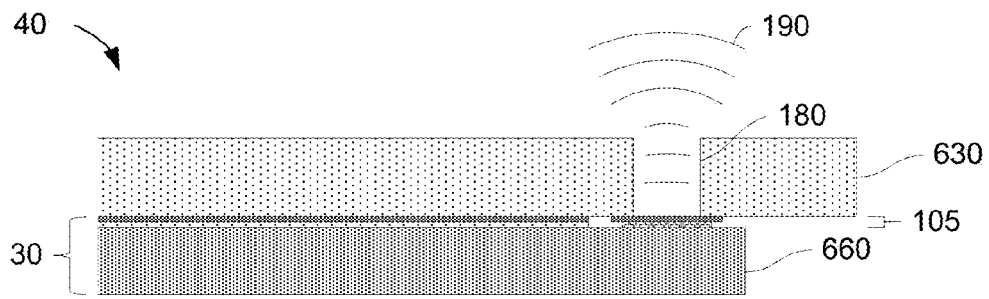
FIGS. 6B-D show examples of a display device that includes a PMUT array near a periphery of a display.
Figure 6C:
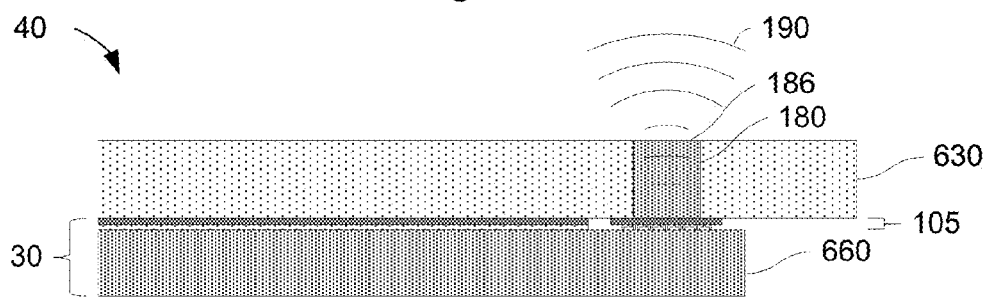
Figure 6D:
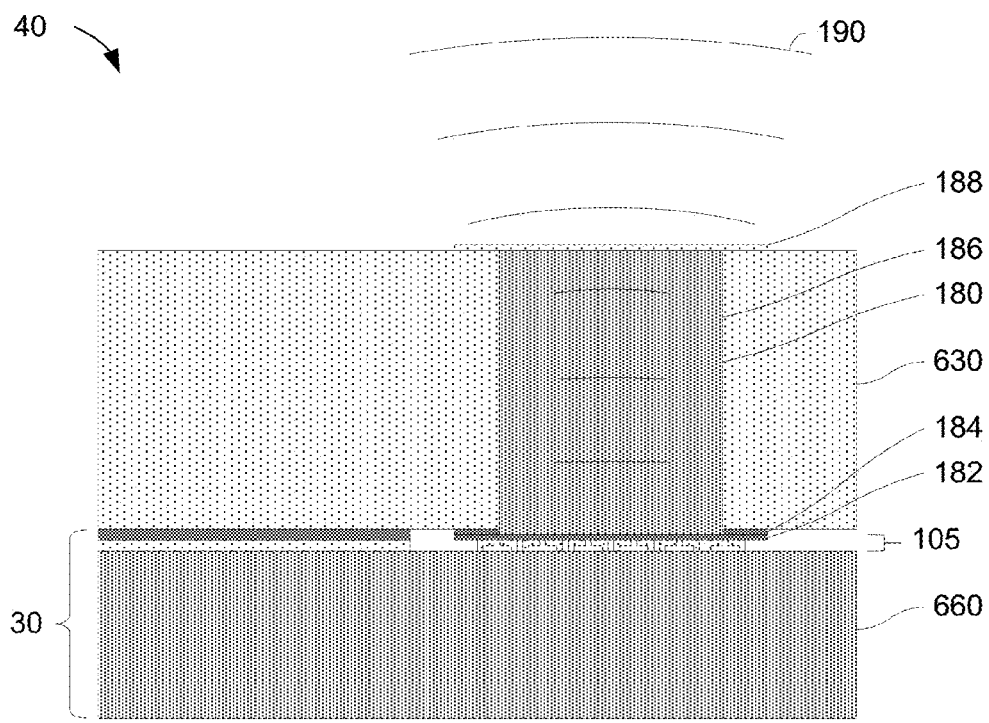

FIGS. 6B-D show examples of a display device that includes a PMUT array near a periphery of a display. As shown in FIG. 6B, a display device 40 (a portion of which is shown) may include a visual display 30 formed on a substrate 660 along with a PMUT array 105. The display 30 may be optically and mechanically coupled to a cover lens or cover glass 630. One or more holes 180 may be formed in the cover glass 630 to allow for the transmission and reception of acoustic and ultrasonic waves 190. The holes 180 may include, for example, one or more circular holes, rectangular or square holes, elongated holes, tapered holes or slots. FIG. 6C shows a portion of a display device 40 with a display 30 and a PMUT array 105 formed on a substrate 660, with the assembly optically and mechanically coupled to a cover glass 630 having one or more holes 180 formed therein. The holes 180 may be filled with an acoustic coupling material 186 such as a silicone gel to provide some environmental protection for the PMUT array 105 while allowing for the transmission and reception of ultrasonic waves 190. FIG. 6D shows a thin cover or coating 188 disposed over a coupling material 186 positioned inside a hole 180 formed in a cover glass 630. An adhesive layer 184 may connect a protective membrane 182 to the cover glass 630, while the protective membrane may be attached to the PMUT array 105 that may be formed on the substrate 660 along with the visual display 30. The coating 188 may be a hard coating such as diamond-like carbon (DLC), an acrylic, or other suitable coating material that is sufficiently compliant for the transmission of ultrasonic waves 190 while providing additional environmental protection for the PMUT array 105, associated circuitry, and display 30 of display device 40.

FIGS. 7A-7F show examples of PMUT arrays disposed in peripheral areas of a display. In these examples, TFT circuitry for the display and TFT circuitry for the PMUT arrays 105 are disposed on the same (e.g., common) substrate.

Figure 7A:
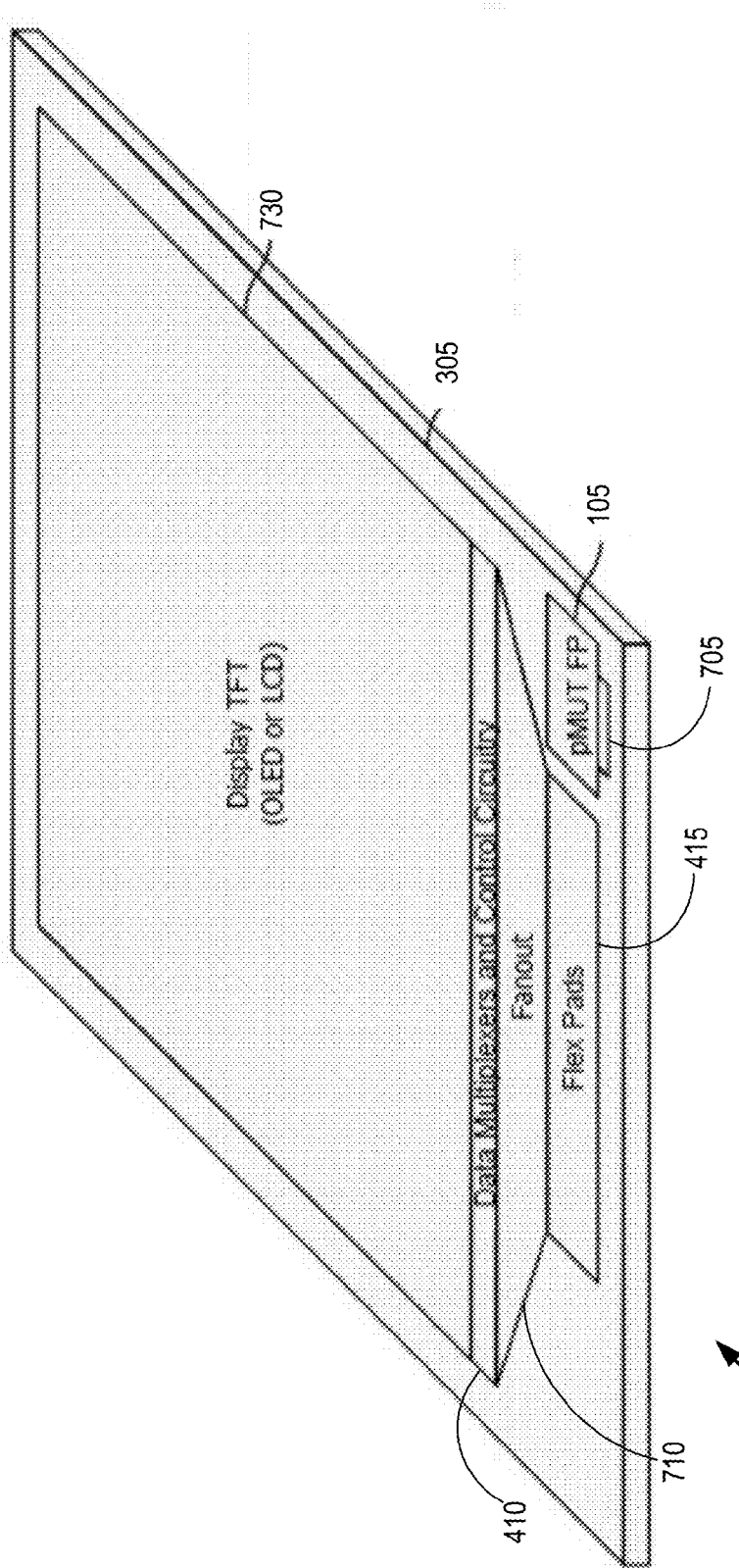
FIGS. 7A-7F show examples of PMUT arrays disposed in peripheral areas of a display.

In FIG. 7A, for example, TFT circuitry 705 for the PMUT array 105 is disposed on the same substrate (the substrate 305) as TFT circuitry 730 for a display. The display may, for example, be an LCD or an OLED display. Here, the data multiplexer and control circuitry 410 may be connected to the flex pads 415 via the fanout region 710. In this example, the PMUT array 105 is a single pMUT array configurable as a fingerprint sensor or ultrasonic touchpad. However, in alternative implementations at least a portion of the PMUT array 105 may be configurable for other functionality, such as gesture detection functionality and/or button functionality. In this implementation, the PMUT array 105 is disposed in a corner of the display device 40, outside of an active display area. The display area may be approximately coextensive with the area of the TFT circuitry 730 shown in FIG. 7A. In some implementations, one or more flex pads on substrate 305 may provide for electrical connection between TFT circuitry 705 and external circuitry. One or more flex cables may be attached and electrically connected to at least a portion of the flex pads 415 on substrate 305. For example, a flex cable may be shared between circuitry for controlling at least a portion of the PMUT array 105 and TFT circuitry 730 for controlling the display.

Figure 7B:
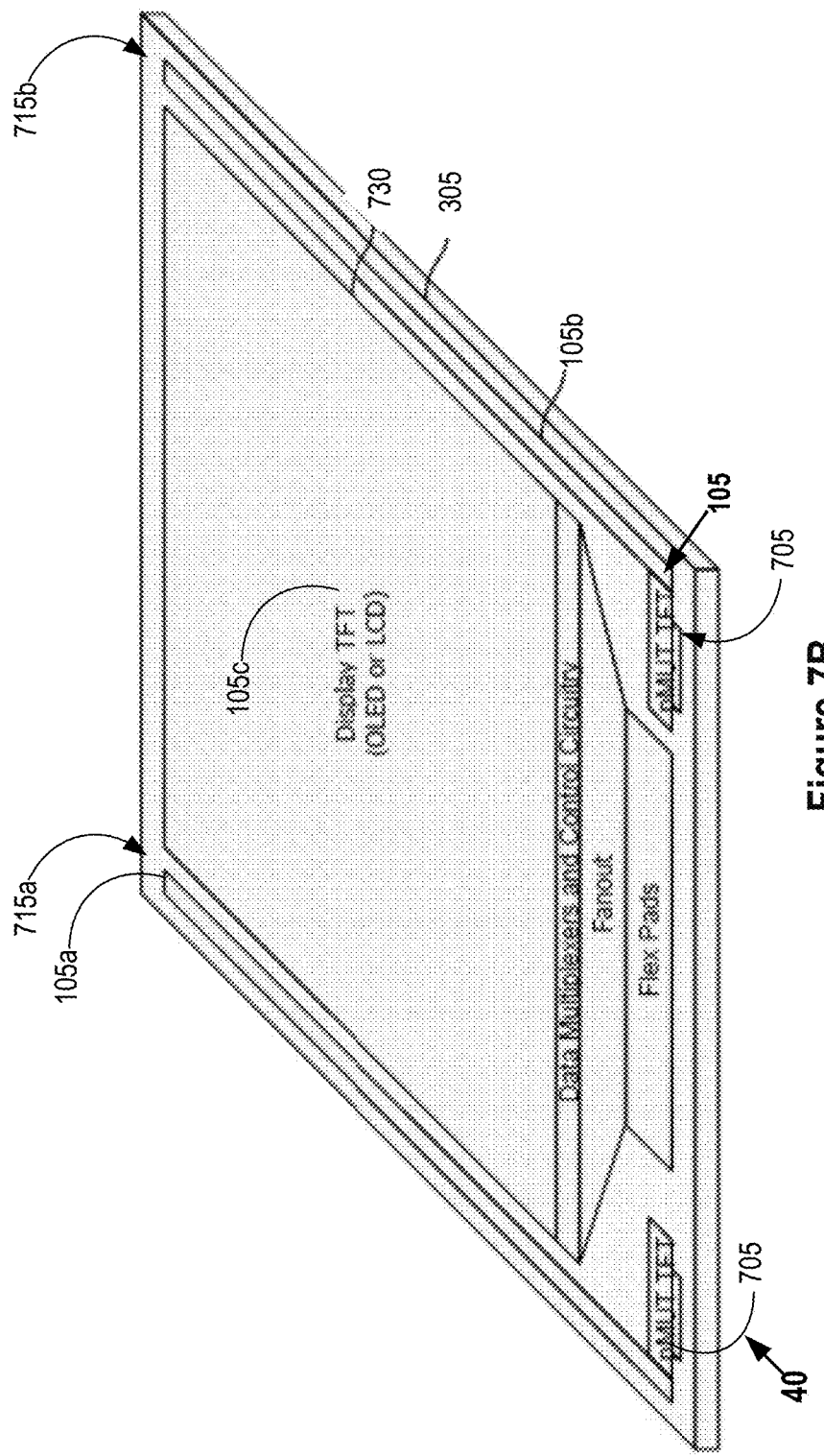

In FIG. 7B, the TFT circuitry 705 for the PMUT array 105 is disposed on the same substrate 305 as the TFT circuitry 730 for a display. In this example, the PMUT array 105 includes PMUT sub-arrays 105a and 105b. In this implementation, the PMUT sub-arrays 105a-b are disposed outside of the active display area. In this implementation, the PMUT sub-arrays 105a and 105b extend along at least a portion of the sides 715a and 715b, respectively, of the display device 40. For example, a one-dimensional string of low-frequency PMUT elements may be positioned along a first side 715a of the display device 40, and another string of low-frequency PMUT elements may be positioned along a second side 715b of the display device 40. In another example, a first PMUT element may be positioned along the first side 715a near one corner of the display device 40, and a second PMUT element may be positioned along the first side 715a near a second corner of the display device 40. A third and fourth PMUT element may be positioned along the second side 715b near a third and fourth corner of the display device 40. The PMUT elements configured near each of the four corners of the display device 40 may allow for gesture detection via triangulation of a finger, hand or other object positioned above the display device 40. More than one PMUT element in a sub-array may be configured in each corner or along one or more sides of the display device 40. In some examples, the PMUT sub-arrays 105a and 105b may be configurable for gesture detection. In this implementation, the PMUT sub-arrays 105a and 105b may be driven by TFT circuitry 705, which may be disposed in two corners of the display device 40. In alternative implementations, the TFT circuitry 705 and PMUT arrays 105 may be configurable for other functionality, such as fingerprint sensor functionality or button functionality.

Figure 7C:
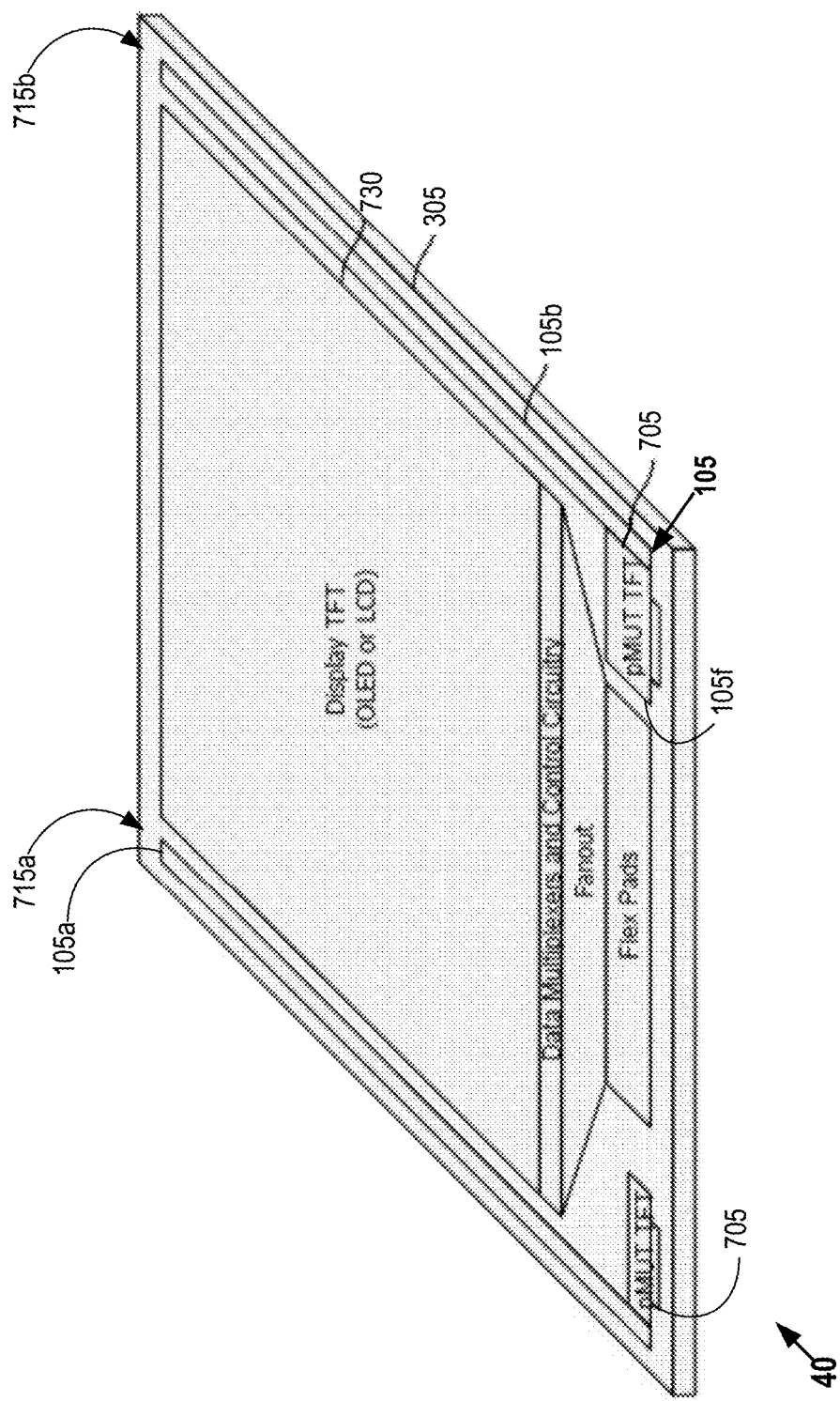

In FIG. 7C, the PMUT array 105 includes PMUT sub-arrays 105a, 105b and 105f, all of which are disposed outside of the active display area. As in the implementation shown in FIG. 7B, the PMUT sub-arrays 105a and 105b may extend along a portion or all of sides 715a and 715b, respectively, of the display device 40. In some examples, the PMUT sub-arrays 105a and 105b may be configurable for gesture detection. In this implementation, the PMUT sub-array 105f may be configurable for fingerprint sensor or ultrasonic touchpad functionality. Accordingly, in this example the TFT circuitry 705 for the PMUT array 105 may include TFT circuitry for fingerprint sensor and gesture detection functionality.

Figure 7D:
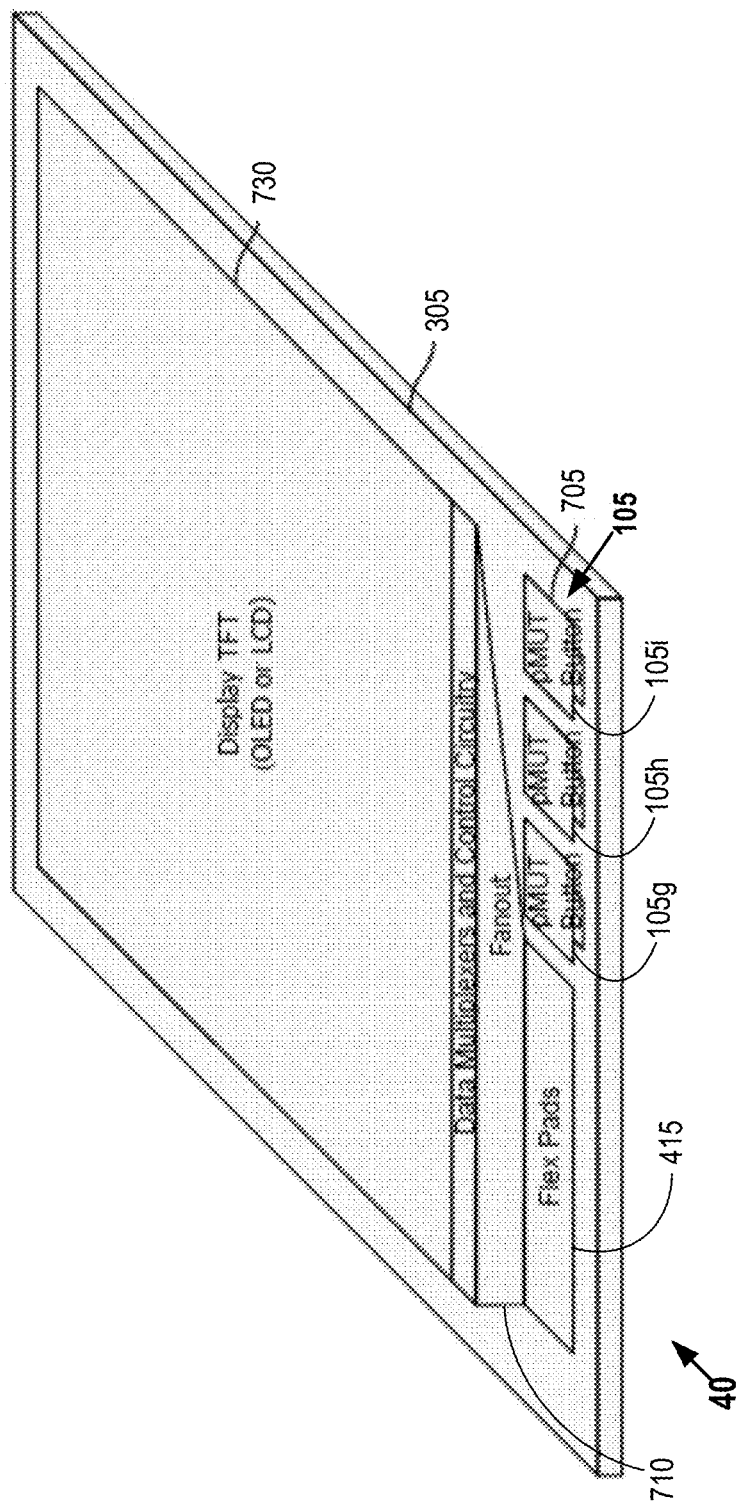

In FIG. 7D, the PMUT array 105 includes PMUT sub-arrays 105g-105i, all of which are disposed outside of the active display area. Here, the fanout region 710 and the flex pads 415 are offset to allow space for the PMUT sub-arrays 105g-105i. In this implementation, the PMUT sub-arrays 105g-105i may be configurable for button functionality. Accordingly, in this example the TFT circuitry 705 for the PMUT array 105 may include TFT circuitry for button functionality. The button functionality may involve controlling some aspect of the display device 40 with or without authentication functionality. Accordingly, such buttons may be referred to as "authenticating" buttons or "non-authenticating" buttons. PMUT sub-arrays for authenticating buttons may include substantially more PMUT elements 310 than PMUT sub-arrays for non-authenticating buttons, to allow for higher resolution imaging of fingerprints. In some examples, a non-authenticating button may correspond with a single PMUT element 310, a small (e.g. two-by-two) array of PMUT elements 310, or a larger array of PMUT elements 310.

In some implementations, at least one of the PMUT sub-arrays 105g-105i may be configurable for authenticating button functionality and at least one of the PMUT sub-arrays 105g-105i may be configurable for non-authenticating button functionality. In such implementations, the TFT circuitry 705 for the PMUT array 105 may include TFT circuitry for authenticating button functionality (e.g., fingerprint sensor functionality) and non-authenticating button functionality. In some implementations, an authenticating button may also serve as a non-authenticating button.

Figure 7E:
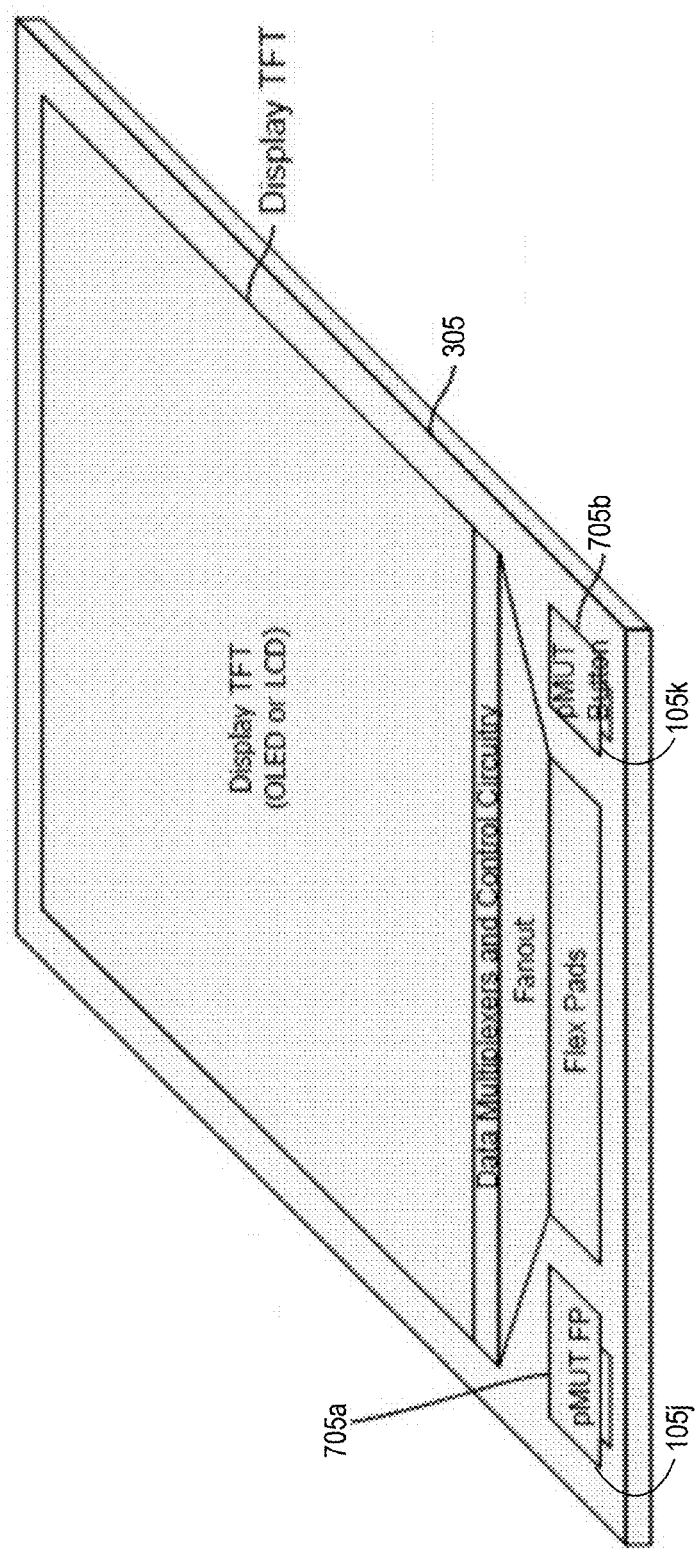

FIG. 7E includes PMUT sub-arrays 105j and 105k, each of which may be located in a corner of the display device 40. In this example, the PMUT sub-array 105j is capable of fingerprint sensor functionality and the PMUT sub-array 105k is capable of button functionality. Accordingly, in this example the TFT circuitry 705a for the PMUT array 105 includes TFT circuitry for fingerprint sensor functionality and the TFT circuitry 705b includes TFT circuitry for button functionality, which may be authenticating button functionality or non-authenticating button functionality.

Figure 7F:
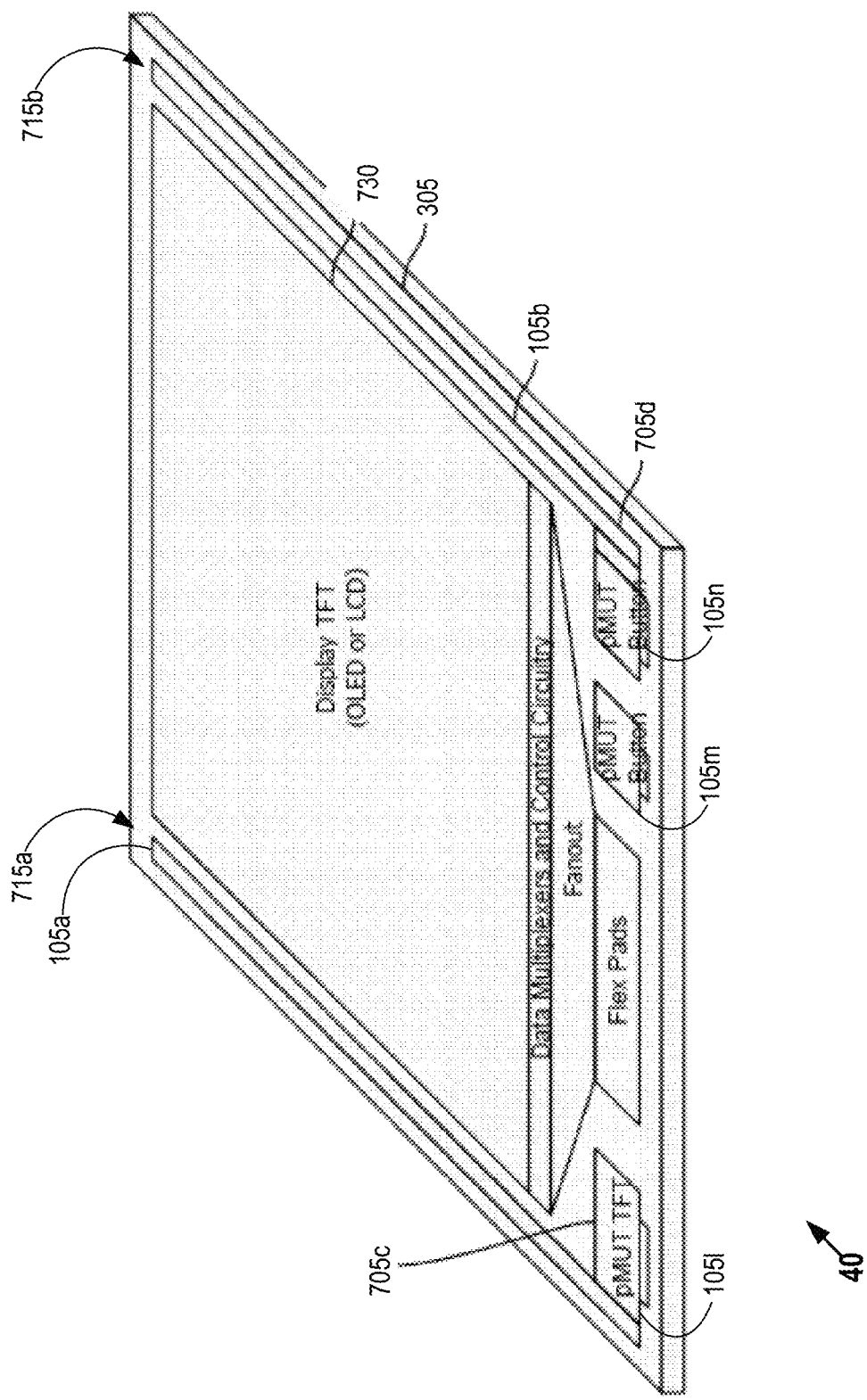

FIG. 7F includes PMUT sub-arrays 105a, 105b and 105l-105n. As in the implementation shown in FIG. 7B, the PMUT sub-arrays 105a and 105b extend along a portion or all of sides 715a and 715b, respectively, of the display device 40. In this example, the PMUT sub-arrays 105a and 105b are configurable for gesture detection.

In this implementation, the PMUT sub-array 105l is capable of providing both fingerprint sensor functionality and gesture detection functionality. Here, the PMUT sub-array 105m is capable of button functionality. In this example, the PMUT sub-array 105n is capable of providing both gesture detection functionality and button functionality. Accordingly, in this example the TFT circuitry 705c for the PMUT array 105 includes TFT circuitry for fingerprint sensor functionality and gesture detection functionality. Here, the TFT circuitry 705d includes TFT circuitry for button functionality, which may be authenticating button functionality or non-authenticating button functionality, as well as TFT circuitry for gesture detection functionality.

In view of the foregoing, it will be apparent to those of ordinary skill in the art that various other configurations are within the scope of the present disclosure. For example, some alternative implementations may include PMUT sub-arrays disposed in each corner of the display periphery that are capable of providing gesture detection functionality. The PMUT sub-arrays may provide full capability to send and receive ultrasonic signals for gesture detection. In some implementations, one or more microphones on a mobile device may be used for receiving ultrasonic waves generated by the PMUT elements to further aid in gesture detection. Typical microphones have limited audio range (e.g. 100 to 10,000 Hz response), whereas higher performing audio microphones may be responsive to ultrasonic frequencies up to 180 kHz or 200 kHz. The microphones may be positioned at various locations in the mobile device, such as near the bottom of the device face. High-performance phones may have multiple microphones on the front and/or back of the phone enclosure for enhanced audio clarity and noise cancellation. Microphones with a high frequency response may aid in gesture detection along with PMUT elements operating in a receive mode. Therefore, in some alternative implementations, at least some receivers used for gesture detection may be microphones of a display device.

In some implementations, a touch panel and at least portions of the PMUT array 105 may share a common flex cable. According to some implementations, a touch panel substrate or a cover glass may have additional electrodes for topside electrical connections to at least a portion of the PMUT array 105 located in the periphery of a display area. In some such implementations, these additional electrodes may provide electrical connectivity with at least a portion of a control system.

Some such implementations may have a control system that includes separate TFT circuitry disposed on separate substrates for the display and for at least a portion of the PMUT array 105, which may be disposed on a periphery of the display. In some such implementations, these additional electrodes may be configured for electrical connectivity with circuitry, such as TFT circuitry, with a portion of the PMUT array 105 configured for fingerprint sensor functionality and/or gesture detection functionality. In some such implementations, these additional electrodes may be configured for electrical connectivity with circuitry, such as TFT circuitry, with a portion of the PMUT array 105 configured for button functionality (e.g., authenticating or non-authenticating button functionality).

Figure 8A:
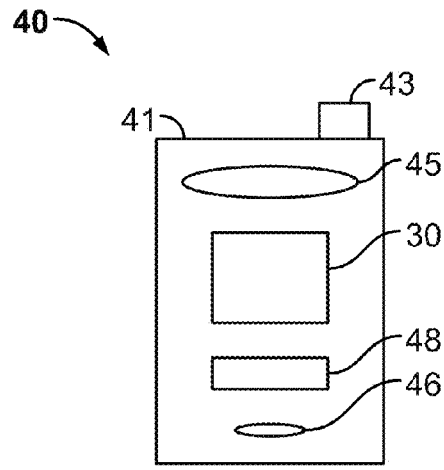
FIGS. 8A and 8B show examples of system block diagrams illustrating a display device that includes at least one PMUT array as described herein.
Figure 8B:
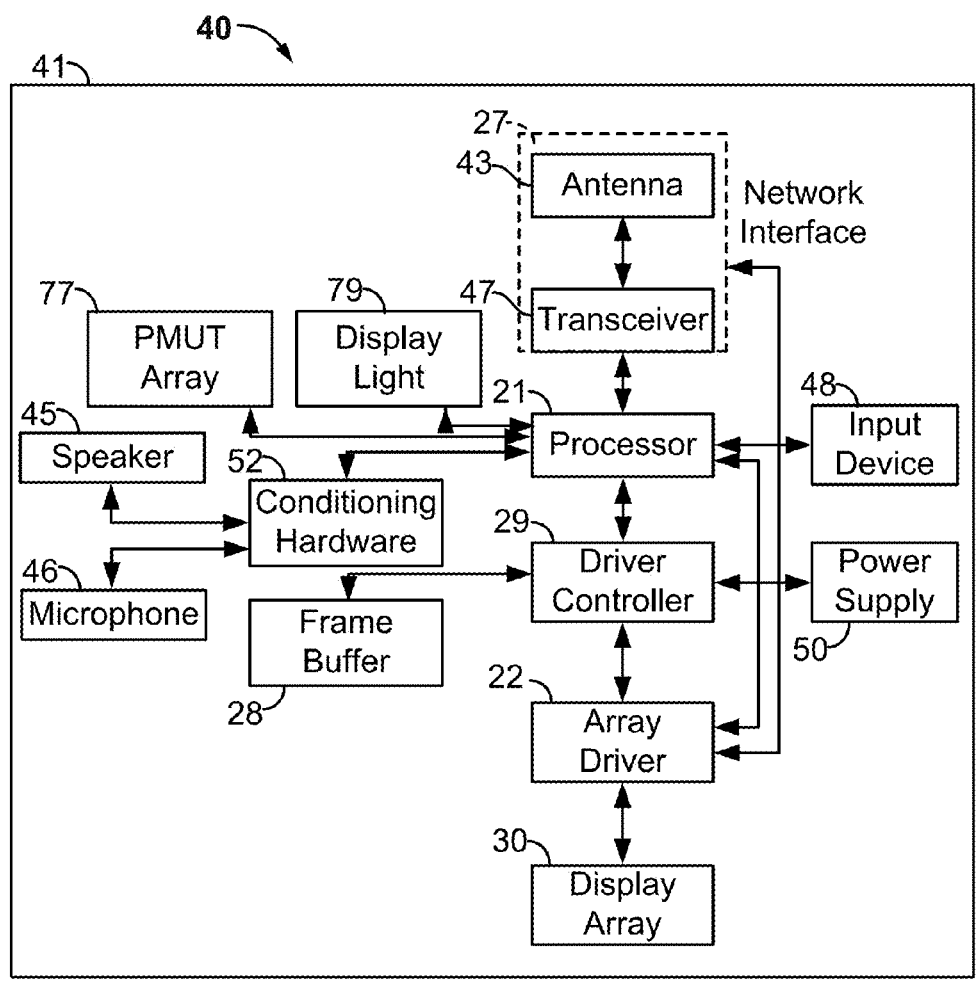

FIGS. 8A and 8B show examples of system block diagrams illustrating a display device that includes at least one PMUT array as described herein. The display device 40 can be, for example, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and one or more microphones 46. The housing 41 can be formed from any of a variety of manufacturing processes, including injection molding and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can include a flat-panel display, such as plasma, EL, OLED, STN LCD, or TFT LCD, or a non-flat-panel display, such as a CRT or other tube device. In addition, the display 30 can include an interferometric modulator (IMOD) based display.

The components of the display device 40 are schematically illustrated in FIG. 8B. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be capable of conditioning a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 8B, can be capable of functioning as a memory device and be capable of communicating with the processor 21. In some implementations, a power supply 50 can provide power to substantially all components in the particular display device 40 design.

In this example, the display device 40 may also include one or more linear or two-dimensional PMUT arrays 77. In some implementations, at least a portion of the PMUT array 77 may be disposed behind the display 30. In some such implementations, a PMUT array 77 may be disposed behind only part of the display 30, whereas in other implementations a PMUT array 77 may be disposed behind substantially all of the area of the display 30. In some implementations, at least a portion of PMUT array 77 may be included within one or more display pixels of display array 30. The processor 21 may be a portion of a control system that is capable of controlling the PMUT array 77 (at least in part), as described herein. Accordingly, a control system 110 as described elsewhere herein may include the processor 21 and/or other elements of the display device 40, such as TFTs.

In some implementations, the processor 21 (and/or another element of the control system 110) may be capable of providing input for controlling the display device 40 according to one or more gestures detected when the PMUT array 77 is operating in a low-frequency mode. In some implementations, the processor 21 (and/or another element of the control system 110) may be capable of providing input for controlling the display device 40 according to one or more touch locations and/or movements determined when the PMUT array 77 is operating in a medium-frequency mode. In some implementations, the processor 21 (and/or another element of the control system 110) may be capable of providing input for controlling the display device 40 according to fingerprint data or stylus input data determined when the PMUT array 77 is operating in a high-frequency mode.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display 30 are appropriate for any of the types of displays described herein. For example, the driver controller 29 can be a conventional display controller or an IMOD display element controller, such as a multi-state IMOD (MS-IMOD) display element controller). Additionally, the array driver 22 can be a conventional driver or a bi-stable display driver (such as an MS-IMOD display element driver). Moreover, the display 30 can be a conventional display array or a bi-stable display array (such as a display including an array of IMOD display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be capable of allowing, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be capable of functioning as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be capable of receiving power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single—or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium, such as a non-transitory medium. The processes of a method or algorithm disclosed herein may be implemented in a processor-executable software module which may reside on a computer-readable medium. Computer-readable media include both computer storage media and communication media including any medium that can be enabled to transfer a computer program from one place to another. Storage media may be any available media that may be accessed by a computer. By way of example, and not limitation, non-transitory media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower", "over" and "under", and "overlying" and "underlying" are sometimes used for ease of describing the figures, and indicate relative positions corresponding to the orientation of the figure on a properly oriented page, and may not reflect the proper orientation of the device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A display device, comprising:
a substrate;
a display coupled to the substrate;
a piezoelectric micromechanical ultrasonic transducer (PMUT) array proximate the display, wherein at least a portion of the PMUT array resides on the substrate;
a plurality of thin-film transistors (TFTs), at least a first array of the TFTs residing on the substrate and including circuitry for controlling the display and at least a second array of the TFTs residing on the substrate and including circuitry for controlling at least a portion of the PMUT array; and
a control system.

2. The display device of claim 1, wherein the control system is capable of:
making a determination whether to operate at least a portion of the PMUT array in at least one of a low-frequency mode or a high-frequency mode; and
controlling at least a portion of the PMUT array to operate in at least one of the low-frequency mode or the high-frequency mode, according to the determination.

3. The display device of claim 2, further including an interface system, wherein the determination is made, at least in part, according to input received from the interface system.

4. The display device of claim 2, wherein the low-frequency mode corresponds to a frequency range of approximately 50 kHz to 200 kHz.

5. The display device of claim 2, wherein the low-frequency mode corresponds to a gesture detection mode, wherein free-space gestures near the display may be detected.

6. The display device of claim 2, wherein the high-frequency mode corresponds to a frequency range of approximately 1 MHz to 25 MHz.

7. The display device of claim 2, wherein the high-frequency mode corresponds to a fingerprint sensor mode or a stylus detection mode.

8. The display device of claim 7, wherein the control system is capable of performing an authentication process based, at least in part, on fingerprint data acquired while the PMUT array operates in the fingerprint sensor mode.

9. The display device of claim 8, further including a memory system, wherein the authentication process involves:
providing a prompt, via the display, to place at least one finger on a surface of the display device;
receiving, via at least a portion of the PMUT array, at least one fingerprint image;
determining received fingerprint data corresponding to the at least one fingerprint image; and
comparing the received fingerprint data with stored fingerprint data in the memory system.

10. The display device of claim 2, wherein the control system is capable of:
   making a determination whether to operate at least a portion of the PMUT array in the high-frequency mode, the low-frequency mode or a medium-frequency mode; and
   controlling at least a portion of the PMUT array to operate in the high-frequency mode, the low-frequency mode or the medium-frequency mode, according to the determination.

11. The display device of claim 10, wherein the display device is capable of providing touch sensor functionality when the control system is controlling at least a portion of the PMUT array to operate in the medium-frequency mode.

12. The display device of claim 10, wherein the medium-frequency mode corresponds to a frequency range of approximately 200 kHz to 1 MHz.

13. The display device of claim 2, wherein the control system is capable of controlling first PMUT elements of the PMUT array to operate in the low-frequency mode and second PMUT elements of the PMUT array to operate in the high-frequency mode.

14. The display device of claim 2, wherein the control system is capable of controlling a PMUT element of the PMUT array to operate in the low-frequency mode and to operate in the high-frequency mode.

15. The display device of claim 1, wherein the PMUT array is a piezoelectric micromechanical ultrasonic transducer (pMUT) array or a capacitive micromechanical ultrasonic transducer (cMUT) array.

16. The display device of claim 1, wherein the control system is capable of addressing at least a portion of the PMUT array for at least one of wavefront beam forming, beam steering, receive-side beam forming, or selective readout of returned signals.

17. The display device of claim 16, wherein the control system is capable of addressing at least a portion of the PMUT array to produce wavefronts of a substantially planar, spherical or cylindrical shape.

18. The display device of claim 16, wherein the control system is capable of addressing at least a portion of the PMUT array to produce constructive or destructive interference in at least one location.

19. The display device of claim 1, wherein the control system is capable of exciting PMUT elements of the PMUT array and detecting responses via the same PMUT elements.

20. The display device of claim 1, wherein the control system is capable of controlling a first PMUT element of the PMUT array as an acoustic transmitter and a second PMUT element of the PMUT array as an acoustic receiver.

21. The display device of claim 1, wherein at least a portion of the PMUT array is an active matrix PMUT array.

22. The display device of claim 21, wherein the active matrix PMUT array includes drive circuitry and sense circuitry.

23. The display device of claim 21, wherein the active matrix PMUT array includes at least one of row and column addressing circuitry, multiplexer circuitry, demultiplexer circuitry, local amplification circuitry or analog-to-digital conversion circuitry.

24. The display device of claim 1, wherein at least a portion of the PMUT array is disposed behind only a part of the display.

25. The display device of claim 1, wherein at least a portion of the PMUT array is disposed in a peripheral area of the display.

26. The display device of claim 1, wherein the control system is capable of controlling a portion of the PMUT array that is disposed in the peripheral area of the display for at least one of fingerprint sensor functionality, signature pad functionality, stylus detection functionality, gesture detection functionality or button functionality.

27. The display device of claim 1, wherein at least a portion of the PMUT array is disposed behind substantially all of the display.

28. The display device of claim 1, wherein the substrate is a glass substrate.

29. The display device of claim 1, wherein the circuitry for controlling at least a portion of the PMUT array and the circuitry for controlling the display are capable of sharing a flex cable.

30. The display device of claim 1, further comprising:
   a cover glass;
   electrodes disposed on the cover glass, the electrodes configured for topside electrical connections to circuitry for controlling at least a portion of the PMUT array.

31. The display device of claim 30, wherein the electrodes are configured for connections with circuitry for at least one PMUT element that is disposed on a periphery of the display.

32. The display device of claim 1, wherein a single PMUT element of the PMUT array corresponds with a single pixel of the display.

* * * * *